United States Patent [19]
Park et al.

[11] Patent Number: 5,986,500
[45] Date of Patent: Nov. 16, 1999

[54] COMBINED LINEAR POWER AMPLIFYING DEVICE AND METHOD

[75] Inventors: Jong-Tae Park, Seongnam; Young-Kon Lee, Seoul; Hong-Kee Kim, Seongnam; Young Kim; Seung-Won Chung, both of Seoul; Seong-Hoon Lee, Seongnam; Soon-Chul Jeong, Ahnyang; Chul-Dong Kim; Ik-Soo Chang, both of Seoul, all of Rep. of Korea

[73] Assignee: Samsung Electronics Co., Ltd., Rep. of Korea

[21] Appl. No.: 09/001,206

[22] Filed: Dec. 30, 1997

[30] Foreign Application Priority Data

Dec. 30, 1996 [KR] Rep. of Korea ............... 96-76706
Dec. 19, 1997 [KR] Rep. of Korea ............... 97-70435

[51] Int. Cl.⁶ ............... H03F 3/68; H03F 1/14; H02H 7/20
[52] U.S. Cl. ............... 330/124 D; 330/51; 330/298
[58] Field of Search ............... 330/124 R, 124 D, 330/51, 207 P, 298

[56] References Cited

U.S. PATENT DOCUMENTS

| | | |
|---|---|---|
| 3,922,617 | 11/1975 | Denniston et al. . |
| 4,439,740 | 3/1984 | Harrington ............... 330/124 R |
| 4,885,551 | 12/1989 | Myer . |
| 4,929,906 | 5/1990 | Voyce et al. . |
| 4,943,783 | 7/1990 | Nojima . |
| 4,967,164 | 10/1990 | Sari . |
| 5,077,532 | 12/1991 | Obermann et al. . |
| 5,119,040 | 6/1992 | Long et al. . |
| 5,130,663 | 7/1992 | Tattersall, Jr. . |
| 5,166,634 | 11/1992 | Narahashi et al. . |
| 5,237,288 | 8/1993 | Cleveland . |
| 5,256,987 | 10/1993 | Kibayashi et al. ............... 330/51 |
| 5,304,945 | 4/1994 | Myer . |
| 5,307,022 | 4/1994 | Tattersall, Jr. et al. . |
| 5,327,096 | 7/1994 | Sakamoto et al. . |
| 5,455,537 | 10/1995 | Larkin et al. . |
| 5,491,454 | 2/1996 | Matz . |
| 5,523,716 | 6/1996 | Grebliunas et al. . |
| 5,524,286 | 6/1996 | Chiesa et al. . |
| 5,786,727 | 7/1998 | Sigmon ............... 330/124 R |

FOREIGN PATENT DOCUMENTS 0 411 180A1 2/1991 European Pat. Off. .
WO 91/07813 5/1991 WIPO .

*Primary Examiner*—Robert Pascal
*Assistant Examiner*—Patricia T. Nguyen
*Attorney, Agent, or Firm*—Dilworth & Barrese

[57] ABSTRACT

A device and a method for combining outputs of a plurality of linear power amplifiers while preventing loss of signals. The combined linear power amplifying device, including: a power divider module which has paths connected respectively between one input terminal and a plurality of output terminals and switches connected respectively to each of the output terminals, for dividing power of a RF signal input to the power divider module and respectively outputting the divided power to the output terminals; a power combiner module which has paths connected respectively between a plurality of input terminals and one output terminal and the switches connected respectively to each of the input terminals, for combining power of a RF signal input to the power combiner module and outputting the combined power; and linear power amplifiers which are connected between the output terminals of the power divider module and the input terminals of the power combiner module, for linearly amplifying the RF signal power-divided in the power divider module thereby outputting the linearly amplified signal to the power combiner module, and upon generation of a failed state of the linear power amplifiers, the failed amplifier opening the path of the affected RF signal by turning off the corresponding switches in said power divider module and said power combiner module.

25 Claims, 22 Drawing Sheets

COMBINED LINEAR POWER AMPLIFYING DEVICE AND METHOD

BACKGROUND OF THE INVENTION

1. Field of the Invention

The present invention relates to a high power amplifying device and method and, more particularly, to a device for combining outputs of a plurality of linear power amplifiers and outputting the combined outputs and a method therefor.

2. Description of the Related Art

In general, high power amplifiers (HPAs) have to be included in digital mobile communication systems to amplify and output a transmitting RF signal (TX RF signal). Also, in order to amplify their outputs to a maximum power level, such HPAs typically operate in the vicinity of their saturation region which has non-linear characteristics. However, if more than two carrier waves, i.e., multi-carrier waves, are commonly applied to and amplified by a HPA, the non-linear characteristics near the saturation region introduce unwanted intermodulation distortion signals (IMD) and other forms of signal distortion and/or loss.

Thus, although the input RF signal should be decreased by a number of dB so as to be amplified in the linear region, thereby reducing noise of the intermodulation distortion component, there is a problem in that output power may be lowered. In the case that a linearizer is employed to compensate for the non-linear characteristics near the saturation region of the high power amplifier, it is possible to considerably reduce the intermodulation distortion signal which may be generated upon commonly amplifying the multi-carrier waves in the saturation region. An amplifier which employs a linearizer and the power amplifier, as discussed above, is called as a linear power amplifier (LPA).

Thus, since the intermodulation distortion component, as stated above, causes the deterioration of the quality of the transmission as a noise source, the intermodulation distortion signal of the linear power amplifier used for a mobile communication system, such as a code division multiple access (CDMA) system, is required to be about −45 dBc necessarily in an operation bandpass while about −60 dBc elsewhere, as per a spurious standard. Conventionally, when $P_{1\ dB}$ is output in an A-class linear power amplifier, a third intermodulation distortion signal (3rd IMD) becomes −20 dBc, approximately. Therefore, the output of the linear power amplifier should be reduced by about 20 dBc to obtain the intermodulation distortion signal of about −60 dBc in the above A-class linear power amplifier. Also, when the multi-carrier waves are input thereto, the output thereof should be again reduced by about 80 dBc in consideration of the peak value of the output thereof. That is, the A-class linear power amplifier of rated output 12 watts is required to provide an average output of about 20 watts. Since reducing the output of an A-class linear power amplifier is difficult to do, it is generally desirous to provide a linear power amplifier having given linear characteristics by employing a linearizer with an AB-class linear power amplifier having good power efficiency.

At this time, the linear power amplifier used for the above digital mobile communication systems requires that the high power amplifier have a very high output. Accordingly, there is generally known a conventional method to combine outputs of a plurality of low power linear power amplifiers in order to amplify the RF signal to a desired output level. Such a power combining method is disclosed in "Planar Electrically Symmetric n-way Hybrid Power Dividers/Combiners" (IEEE Transactions on Microwave Theory and Techniques, vol, MTT-28, No. 6, June 1980, pp.555–563).

In such a conventional combining method, an n-Way Winkinson-Type Combiner and an n-Way Radial-Type Combiner are exemplary of an n-way RF power combiner. Hereinabove, the n-Way Winkinson-Type Combiner is constructed with $\lambda_0/4$ transmission path and resistors and the n-Way Radial-Type Combiner is constructed with $\lambda_0/2 \sim \lambda_0/4$ transmission paths.

In the event that the above n-way RF power combiners combine n power supply sources having the same characteristics in amplitude and in phase as each other, the output power is reduced as much as the number of abnormally operating (failed) power amplifiers. In other words, when a failed or abnormal state occurs in m power amplifiers in a high power amplifier using n power amplifiers (where m is less than n), the power amplifying signal combined and outputted is proportional in size to the number of failed power amplifiers. And, the greater the number of the failed amplifiers that occur, the more the output power of $-20 \log(1-m/n)$dB is reduced. In such a case, n denotes the number of the power amplifiers and m denotes the number of failed power amplifiers. Upon the failed state being generated in even one power amplifier of an RF amplifier having a small number of power amplifiers disposed to combine the power, such RF amplifier has difficulty in achieving its objective amplifying efficiency. Thus, there is a problem in that the above-identified amplifier disadvantageously becomes a very inefficient power combiner. As a result, in the event that the high power RF amplifier is constructed with low power RF amplifiers, as stated previously, the above RF amplifier has to have no failed amplifiers.

Likewise, when it is desirable to combine the outputs of the n linear amplifiers by utilizing the above-mentioned n-way power amplifier, the power of the received RF signal is divided by n, the divided n RF signals are amplified through the n linear power amplifiers, and the amplified signals are again combined and outputted. At this time, when an abnormal (failed) state occurs in any particular linear power amplifier forming the power combiner, such single failed amplifier negatively affects the overall output of the power combiner. Further, such failure also negatively affects the overall output of the transmitter. Accordingly, it would be desirable and advantageous to be able to sense the state of the linear power amplifiers before amplifying operation in order to detect a failed condition in any of such amplifiers.

SUMMARY OF THE INVENTION

Therefore, it is an object of the present invention to provide devices and methods for combining outputs of a plurality of linear power amplifiers while preventing signal loss.

It is another object of the present invention, to provide a combined linear power amplifying device including a plurality of linear power amplifiers and method associated therewith, which upon occurrence of a failed or abnormal state (condition) with respect to at least one of the plurality of linear power amplifiers in the combined linear power amplifying device, performs the steps of: removing the at least one linear amplifier which has experienced the failed condition from operation; evenly dividing the power of the signal to be otherwise applied to the at least one failed linear power amplifier among the normally operating linear power amplifiers; and stably outputting the power thereof.

It is another object of the present invention, to provide a combined linear power amplifying device and a method associated therewith, which includes: a power divider; a plurality of linear power amplifiers, and a power combiner, the device diagnosing the individual state of each of the linear power amplifiers and, upon an abnormal or failed state being diagnosed in at least one amplifier, generating an indication of the failure of such corresponding linear power amplifier and providing such indication external to the device.

To achieve these and other objects of the present invention, one embodiment of a combined linear power amplifying device of the present invention comprises: a power divider module which has paths connected respectively between one input terminal and a plurality of output terminals and switches connected respectively to each of the output terminals, for dividing power of an RF signal input thereto and respectively outputting the divided power to the output terminals; a power combiner module which has paths connected respectively between a plurality of input terminals and one output terminal and switches connected respectively to each of the input terminals, for combining power of the RF signal input thereto and outputting the combined power; and a plurality of linear power amplifiers which are respectively connected between the output terminals of the power divider module and the input terminals of the power combiner module, for linearly amplifying the RF signal power-divided in the power divider module and outputting the linearly amplified signal to the power combiner module, and upon generation of a failed state in at least one of the linear power amplifiers, removing a path associated with the at least one failed amplifier by turning off the switches associated therewith in the power combiner module and the power divider module.

These and other objects, features and advantages of the present invention will become apparent from the following detailed description of illustrative embodiments thereof, which is to be read in connection with the accompanying drawings, in which like reference symbols indicate the same or similar components.

DETAILED DESCRIPTION OF PREFERRED EMBODIMENTS

In the following description, numerous specific details such as components are set forth to provide a more thorough understanding of the present invention. However, it will be apparent, to one skilled in the art that the present invention may be practiced without these specific details. Detailed descriptions regarding known functions and constructions which unnecessarily obscure the subject matter of the present invention will be avoided.

Figure 1:
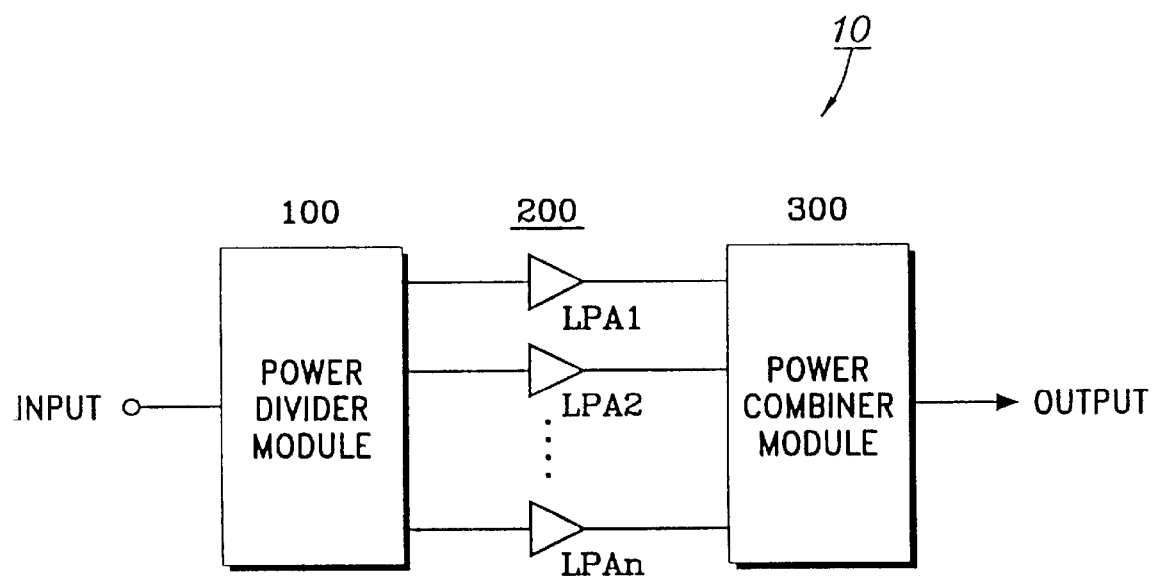
FIG. 1 is a schematic/block diagram showing an embodiment of a combined linear power amplifying device according to the present invention.

FIG. 1 is a schematic/block diagram showing an embodiment of a combined linear power amplifying device according to the present invention. The inventive combined linear amplifying device 10 includes a power divider module 100 for dividing the power of inputted RF signals. The combined linear amplifier device 10 also includes linear power amplifier module 200 operatively coupled to the power divider module 100 for amplifying each of corresponding RF signals. The number of amplifiers in module 200 corresponds to the number of power-divided RF signals. The amplifying device of the present invention also includes a power combiner module 300, operatively coupled to the amplifier module 200, for combining and outputting the output of the signals outputted by the linear power amplifiers 200.

Figure 2:
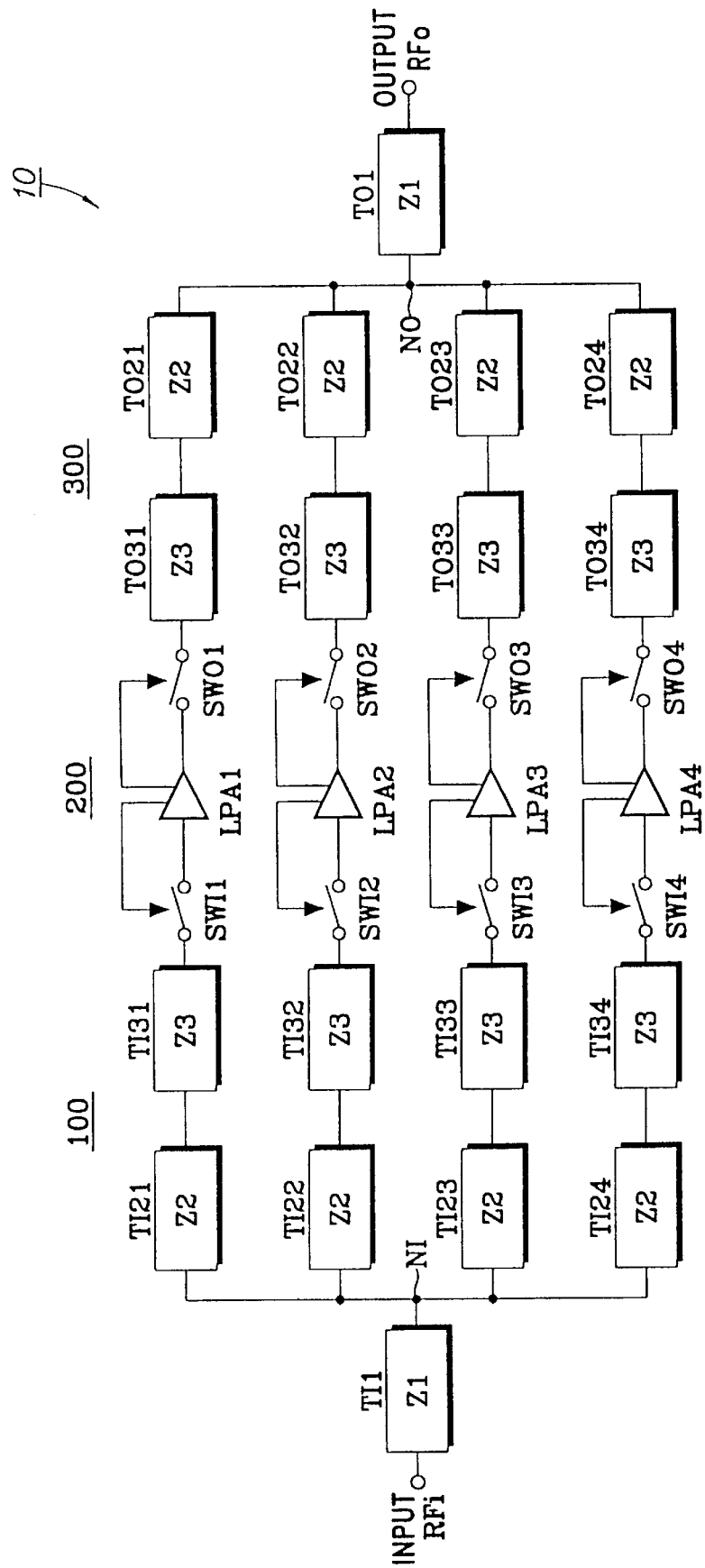
FIG. 2 is a schematic/block diagram showing an embodiment of a combined linear power amplifying device for combining outputs of four linear power amplifiers according to the present invention.

FIG. 2 is a schematic/block diagram showing an embodiment of a combined linear power amplifying device for combining outputs of four linear power amplifiers. Such embodiment shows the construction of a 4-way combined linear power amplifying device employing four linear power amplifiers LPA1 to LPA4, according to the present invention. It is to be appreciated that a 4-way device is illustrated for exemplary purposes only and, thus, the present invention encompasses n-way combined linear power amplifying devices.

Referring now to the embodiment of the power divider module 100 of FIG. 2, a transmission path TI1 is connected between an input terminal of the amplifying device of the invention and a node NI. Transmission paths TI21 to TI31 are serially connected between the node NI and a switch SWI1. Transmission paths TI22 and TI32 are serially connected between the node NI and a switch SWI2. Transmission paths TI23 and TI33 are serially connected between the node NI and a switch SWI3. Transmission paths TI24 and TI34 are serially connected between the node NI and a switch SWI4. The switches SWI1 to SWI4 are respectively connected with input terminals of each of the corresponding linear power amplifiers LPA1 to LPA4. Switching control of the switches SWI1 to SWI4 is provided by the corresponding linear power amplifiers LPA1 to LPA4, as will be explained. Herein, the characteristic impedance of the transmission path TI1 is Z1, the characteristic impedance of the transmission paths TI21 to TI24, connected in parallel to the node NI, are same as one another, that is, Z2, and the characteristic impedance of the transmission paths TI31 to TI34 are same as one another, that is, Z3. Also, all of the transmission paths TI1, TI21 to TI24, and TI31 to TI34 of the power divider module 100 are preferably about one-quarter wavelength ($\lambda/4$)) paths, which are capable of being used with microstrip lines using a teflon substrate. As well, the switches SWI1 to SWI4 which function as RF switches may be RF switches having a part number "MMS-12-F-PC" and manufactured and sold by the K & L Co., Ltd in U.S.A. The switches SWI1 to SWI4 may be an integral part of the power divider module or separate therefrom.

Referring now to the embodiment of the power combiner module 300 of FIG. 2, switches SWO1 to SWO4 are connected between output terminals of each corresponding linear power amplifiers LPA1 to LPA4 and switching control of the switches SW01 to SW04 is provided by the corresponding LPA1 to LPA4, as will be explained. Transmission paths TO31 and TO21 are serially connected between the switch SWO1 and a node NO. Transmission paths TO32 and TO22 are serially connected between the switch SWO2 and a node NO. Transmission paths TO33 and TO23 are serially connected between the switch SWO3 and the node NO. Transmission paths TO34 and TO24 are serially connected between the switch SWO4 and the node NO. A transmission line TO1 is connected to an output terminal of the amplifying device of the invention and the node NO. The characteristic impedance of the transmission line TO1 is Z1, the characteristic impedance of the transmission paths TO21 to TO24 connected in parallel to the node NO are same as one another, that is, Z2, and the characteristic impedance of the transmission paths TO31 to TO34 are same as one another, that is, Z3. Also, all of the transmission paths TO1, TO21 to TO24, and TO31 to TO34 of the power divider module 100 are preferably about one-quarter wavelength ($\lambda/4$) paths, which are capable of being used with the microstrip lines using the teflon substrate. As well, the switches SWO1 to SWO4 which function as RF switches may be RF switches having a part number "MMS-12-F-PC" and manufactured and sold by the K & L Co., Ltd in U.S.A. Further, the switches SWO1 to SWO4 may be an integral part of the power combiner module or separate therefrom.

The linear power amplifiers LPA1 to LPA4 of the linear power amplifier module 200 are respectively connected between the switches SWI1 to SWI4 and SWO1 to SWO4. It is to be appreciated that each of the linear power amplifiers LPA1 to LPA4 perform a self-test function whereby their operational state is checked, at a regular period, and if a failed state is detected by any one of the amplifiers LPA1 to LPA4, the corresponding input switch SWIn and output switch SWOn are opened, thus, removing the failed amplifier path from operation. Removal of more than one failed amplifier path is also contemplated by the present invention.

Regarding the embodiment of the combined linear power amplifying device as depicted in FIG. 2, the power divider module 100 and the power combiner module 300, in effect, have a reciprocal construction and function as compared to the other. Thus, a preferred operation of the present invention will be described focusing on the power divider module 100.

First, when the switches SWI1 to SWI4 are all turned on (closed), the inputted signal RFi is applied to the node NI by passing through the transmission path TI1. Here, since no open switch exists with respect to the node NI, the power of the RFi signal applied to the node NI is evenly divided four ways and inputted to the corresponding linear power amplifiers LPA1 to LPA4. Then, the linear power amplifiers LPA1 to LPA4 linearly amplify the divided RF signals and respectively output linearly amplified signals. Then, the power combiner module 300 combines the RF signals amplified and outputted from the linear power amplifiers LPA1 to LPA4.

However, if any particular switch among the switches SWI1 to SWI4 is turned off, that is, opened due to the corresponding amplifier detecting a failed state, the corresponding path is removed from the amplifying operation. Thus, for example, if the switch SWI1 is turned off by amplifier LPA1, as will be explained, the transmission paths TI21 to TI31 connected to the switch SWI1 are opened in terms of the node NI. Thus, the combined transmission path of paths TI21 to TI31 becomes a half wave length ($\lambda/2$) path with respect to the central frequency, upon the switch SWI1 being turned off, since the transmission paths TI21 to TI31 are each respectively ($\lambda/4$) transmission paths. Therefore, when the switch SWI1 is turned off, the RF signal is totally reflected and provided to the node NI, thereby consequently generating no loss of the RF signal.

Further, now that the switches SWI2 to SWI4 are turned on, the power of the RF signal at the node NI is evenly divided to be input to the linear power amplifiers LPA2 to LPA4. Here, the amplitude and the phase of the RF signals flowing through the transmission paths have to be adjusted, if possible, equally. This is why the impedance is infinite upon the amplitude and the phase of each inputted signal being equal to each other, so that the isolation between the input terminals can be good. For this reason, the power-divided RF signals can be transmitted to the output terminals thereby preventing loss of power. It is to be appreciated that values of the characteristic impedance of the transmission paths Z1, Z2, and Z3 should be properly set to values, depending upon the range of the operational frequency and the number of the inputted signals, in order to satisfy the condition that $Z2 \geq Z3 \geq Z$.

As a result, if none of the linear power amplifiers LPA1 to LPA4 sense a failed (abnormal) state, the amplifiers LPA1 to LPA4 enable the switches SWI1 to SWI4 and SWO1 to SWO4 to be turned on (closed). Then, the power divider module 100 divides the power of the above inputted signal RFi four ways and applies said power-divided signals, respectively, to the linear power amplifiers LPA1 to LPA4. The linear power amplifiers LPA1 to LPA4 linearly amplify the RF signals respectively power-divided four ways to thereby be outputted. The power combiner module 300 then combines the power of the RF signals amplified and outputted from the linear power amplifiers LPA1 to LPA4 and outputs a final amplified signal RFo.

Therefore, upon the generation of the failed state with respect to any one or more of the power amplifiers LPAn (where n is the number of the particular amplifier), the corresponding linear power amplifier turns off the corresponding RF switches of the power divider module 100 and the power combiner module 300, thus preventing the power of the signal from being applied to the corresponding linear power amplifier LPAn associated therewith. Since the power divider module 100 and the power combiner module 300 evenly divide and combine the power of the signal applied to the corresponding linear power amplifier of the linear power amplifiers LPAn that are operating normally (without a detected failure), the power of the overall signal output by the device 10 of the invention is constantly maintained.

Herein, because the present invention requires a multichannel amplifier for simultaneously amplifying a plurality of the RF signals which may be different from one another, the linear power amplifiers LPA1 to LPA4 are mainly used in the digital mobile communication systems. Thus, the linear power amplifier performs the functions of sensing and controlling the intermodulation distortion noise of a linear compensating circuit, in order to reduce the distortion of the signal by the non-linear operation characteristics of the amplifier and unnecessary wave noise caused due to the intermodulation distortion produced in the event of amplifying various signals by using one amplifier.

Likewise, upon the generation of the failed state of the amplifier in the state where the linear amplifying operation is performed, the linear power amplifiers LPA1 to LPA4 sense the above generation thereof, diagnose the failed state and, if sensed that it is not possible to perform the amplifying function, turns off the corresponding switches SWIn and SWOn.

In the following description, an explanation of the operation of self-diagnosing (i.e., self-testing) the operation and the failed state of the linear power amplifier according to the present invention will be given with reference to FIGS. 3 to 11.

The linear power amplifiers LPA1 to LPA4 may include a linearization system for eliminating the intermodulation distortion component of the output of the power amplifier by using a pilot tone; a predistortion system for generating the predistortion component in an input signal and suppressing the intermodulation distortion component of the output of the power amplifier; a negative feedback system for providing feedback of the intermodulation distortion component and suppressing the intermodulation distortion component included in the output of the power amplifier; and a feedforward system for extracting only the intermodulation distortion component, combining the output of the power amplifier with opposite phase and suppressing the intermodulation distortion component. Hereinafter, it is assumed that the linear power amplifiers LPA1 to LPA4, according to the present invention, use a system for combining a predistortion system and a feedforward system.

Figure 3:
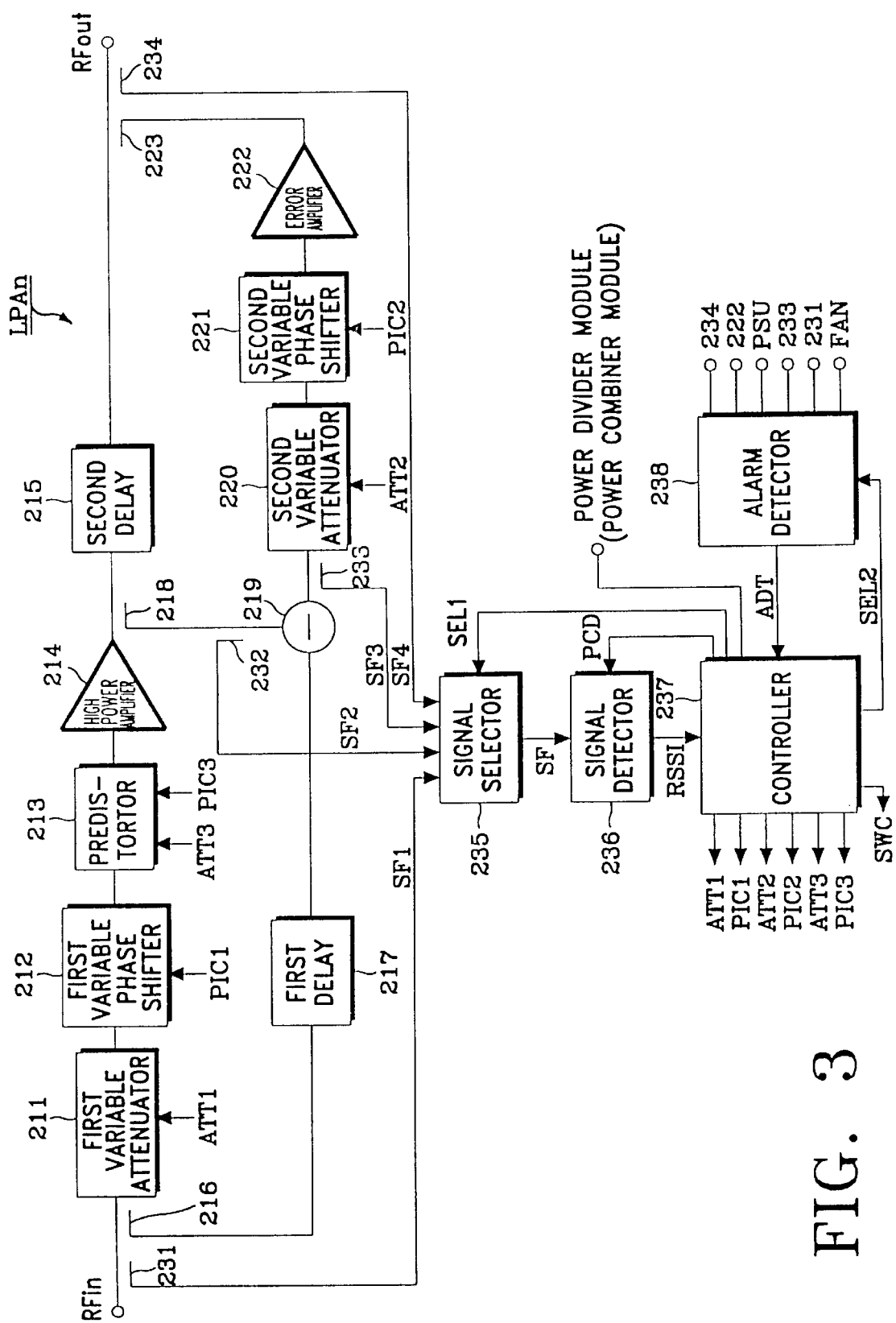
FIG. 3 is a schematic/block diagram showing an embodiment of the linear power amplifier for use in the combined linear power amplifying device in FIGS. 1 and 2.

FIG. 3 is a schematic/block diagram showing an embodiment of a linear power amplifier LPAn (LPAn being any one of the plurality of linear power amplifiers in the module 200) in the combined linear power amplifying device 10 in FIGS. 1 and 2. In this particular embodiment, the linear power amplifier employs the predistortion system and the feedforward system, as stated above.

With respect to FIG. 3, a first variable attenuator 211 controls the attenuation of the gain of the RF signal inputted thereto via an attenuation control signal ATT1 output by a controller 237. A first variable phase shifter 212 which is coupled to receive the output of the first variable attenuator 211, controls the phase of the RF signal input thereto via a phase control signal PIC1 output by the controller 237.

A predistortor 213 receives the RF signal, anticipates the harmonics as the intermodulation distortion component to be generated in a high power amplifier 214 and generates a predistortion signal to compensate therefore. The high power amplifier 214 power amplifies the RF signal output by the predistortor 213 and outputs a power amplified signal. A second delay unit 215 receives the RF signal output by the high power amplifier 214, delays and outputs the input RF signal during the time when the intermodulation distortion signal is applied. The construction as mentioned hereinbefore is considered as the main path of the linear power amplifier LPAn according to a preferred embodiment of the present invention.

A power divider 216 divides the RF signal input to the main path and outputs a divided RF signal. It is possible to use a directional coupler as the power divider 216. A first delay 217 compensates the delay time of the RF signal which occurs in the predistortion and amplification process of the main path. A power divider 218 is positioned at an output terminal of the high power amplifier 214 and divides the output of the high power amplifier 214 output therefrom. Like the power divider 216, a directional coupler can be used as the power divider 218. A signal canceler 219 receives the RF signal output by the first delay 217 and the amplified RF signal output by the high power amplifier 214. The signal canceler 219 cancels the RF signal output by the first delay 217 from the output of the high power amplifier 214, thereby detecting the intermodulation signal caused in the course of amplifying the power. In this embodiment of the present invention, the signal canceler 219 is embodied as a subtractor.

A second variable attenuator 220 receives the intermodulation distortion signal output from the signal canceler 219 and controls the gain of the intermodulation distortion signal via an attenuation control signal ATT2 output by the controller 237. A second variable phase shifter 221 receives the intermodulation distortion signal output from the second variable attenuator 220 and controls the phase of the intermodulation distortion signal via a phase control signal PIC2 output by the controller 237. An error amplifier 222 amplifies the intermodulation distortion signal output by in the second variable phase shifter 221 and outputs the amplified intermodulation distortion signal. A signal coupler 223 couples the output of the error amplifier 222 to the output terminal of the second delay 215. A directional coupler can be used as the signal coupler 223.

The embodiment, as described above, corresponds to a sub-path which generates the signal and is produced for suppressing the intermodulation distortion signal generated upon amplifying the power of the main path.

A power divider 231 is disposed at the input terminal of the linear power amplifier LPAn, divides the input RF signal and outputs a first signal SF1. A power divider 232 is disposed at the output terminal of the high power amplifier 214, divides the amplified RF signal and outputs a second signal SF2. A power divider 233 is disposed at the output terminal of the signal canceler 219, divides the intermodulation distortion signal detected in the signal canceler 219, and outputs a third signal SF3. A power divider 234 is disposed at the output terminal of the linear power amplifier LPAn, divides the output RF signal, and outputs a fourth signal SF4. The power dividers 231 to 234 may be directional couplers. A signal selector 235 receives the above signals, SF1 to SF4, output by the power dividers 231 to 234 and selectively outputs the signal SF which is correspondingly controlled by a first selection signal SEL1(switching control data) output by the controller 237.

A signal detector 236 detects a received signal strength indicator (RSSI) of the signal SF output by the signal selector 235 via control data PCD (PLL control data) which is output by the controller 237 and then outputs an RSSI signal which is converted to direct current. The controller 237 generates the first selection signal SEL1 for selection of the signal SF pertaining to the signal selector 235 and the control data PCD for determining the frequency for detection of the RSSI of the signal SF selected in the signal detector 236.

An alarm detector 238 detects the existence/nonexistence of the failed (abnormal) state of the linear power amplifier LPAn and outputs the detected result. The alarm detector 238 is comprised of detectors capable of detecting various alarm conditions such as, an over power alarm condition (hereinafter, referred to as OVP), a high temperature alarm condition (hereinafter, referred to as TEMP), a standing wave ratio alarm condition (hereinafter, referred to as VSWR), a DC fail alarm condition (hereinafter, referred to as DCF), a loop fail alarm condition (hereinafter, referred to as LOP), a low power alarm condition (hereinafter, referred to as LWP), a fan fail alarm condition (hereinafter, referred to as FAN) of the linear power amplifier LPAn. Further, the alarm detector 238 selects a corresponding detection signal ADT via a second selection signal SEL2 of the controller 237 and outputs the selected detection signal ADT indicative of the failed condition of the amplifier LPAn to the controller 237.

Accordingly, the controller 237 controls overall operations of the linear power amplifier LPA, diagnoses the state of the linear power amplifier LPAn, and removes the path of the signal applied to the linear power amplifier LPAn upon the detection of the failed (abnormal) state with respect to that particular linear power amplifier LPAn.

Most of all, in view of the operation of performing the control function of the linear power amplifier LPAn, the controller 237 analyzes the value of the RSSI signal output by the signal detector 236 and generates the attenuation control signals ATT1 to ATT3 and the phase control signals PIC1 to PIC3, the above signals controlling the corresponding variable attenuator and the corresponding variable phase shifter in order to adjust the gain and the phase of the signal SF corresponding to the above analyzed result of the controller 237. First, in the case where the output of the high power amplifier 214 (output by the power divider 232) is selected, the controller 237 controls the signal detector 236, detects the RSSIs of the harmonics of the inputted RF signal, and judges the size of the RSSIs, thereby generating the attenuation control signal ATT3 and the phase control signal PIC3, each signal respectively for adjusting the attenuation and the phase of the intermodulation distortion signal output by the predistortor 213. Second, when the output of the signal canceler 219 (output by the power divider 233) is selected, the controller 237 controls the signal detector 236, detects the RSSIs of the RF signal contained in the canceled intermodulation distortion signal, and judges the size of the RSSIs, thereby generating the attenuation control signal ATT1 and the phase control signal PIC1, each signal respectively for adjusting the attenuation and the phase of the RF signal inputted in the input terminal of the linear power amplifier. Third, when the amplification signal finally output is selected (output by the divider 234), the controller 237 controls the signal detector 236, detects the RSSIs of the intermodulation distortion signals included in the signal finally output, and judges the size of the RSSIs, thereby generating the attenuation control signal ATT2 and the phase control signal PIC2, each signal respectively for adjusting the attenuation and the phase of the intermodulation distortion signal outputted in the signal canceler 219.

Next, with respect to the operation of diagnosing and controlling the state of the linear power amplifier LPAn, the controller 237 outputs the second selection signal SEL2 to the alarm detector 238 at a regular period, sequentially inputs the detection signals output in the alarm detector 238, checks the state of the detection signals inputted, and detects the existence/nonexistence of the failed state of the linear power amplifier LPAn. At this event, in the failed state thereof, the controller 237 drives a corresponding alarm timer and generates the switching control signal SWC for turning off the RF switches of the power divider module 100 and the power combiner module 300 when maintaining the failed state to set the value of the alarm timer as a set time. Thus, the path including the linear power amplifier detecting the failed condition is removed from the operation of the amplifying device 10 of the invention.

Herein, the operation of linearly amplifying the RF signal, RFin, received at the input of the linear power amplifier LPAn will now be explained. According to a preferred embodiment of the present invention, as illustrated in FIG. 3 above, the linear power amplifier LPAn eliminates the intermodulation distortion signal which can occur in the amplification process by using the predistortion system and the feedforward system. In the above-described embodiment of the present invention, the predistortor 213 first performs the function of removing the intermodulation distortion signal which is output by to the high power amplifier 214. In order to perform the above function, the predistorter 213 anticipates the harmonics which can be generated upon amplification in the high power amplifier 214 and thus adjusts the phase of the harmonics prior to the signal entering the high power amplifier 214 so that the harmonics actually generated by the high power amplifier 214 are cancelled. That is, the predistorter generates harmonics opposite in phase to those expected to be generated in the amplifier 214 so that when applied to the amplifier 214, the harmonics are compensated for and thus cancelled.

However, it is to be appreciated that even in using the predistortion system described above, it is not always possible to completely eliminate the intermodulation distortion signal caused in the linear power amplifier. As a result, a preferred linear power amplifier according to the present invention, first suppresses the intermodulation distortion signal in the predistortor 213, and finally suppresses the intermodulation distortion signal by adapting a feedforward system. The linear power amplifier using a feedforward system, cancels the RF signal in the output of the high power amplifier 214, extracts the intermodulation distortion signal, and couples the extracted intermodulation distortion signal to the signal coupler 223, thereby canceling the intermodulation distortion component. Therefore, when using such a feedforward system, the distortion associated with the intermodulation distortion signal contained in the signal (RF out) amplified and provided to the final output terminal of the linear power amplifier can be suppressed, so that the pure amplified RF signal (RFout) component can, alone, be output.

Accordingly, an embodiment of a linear power amplifier LPAn of the present invention as explained above, first suppresses the intermodulation distortion signal generated in the amplification process of the high power amplifier 214 by using the predistortion system, and second suppresses the remaining intermodulation distortion signal pertaining to the output of the high power amplifier 214 by using the feedforward system. Herein, for the convenience of explanation only, it is to be understood that the explanation of the operation of suppressing the intermodulation distortion signal by using the feedforward system follows the explanation of the operation of suppressing the intermodulation distortion signal by using the predistortion system. As a result, the feedforward operation may actually be performed prior to the predistortion operation.

Figure 7A:
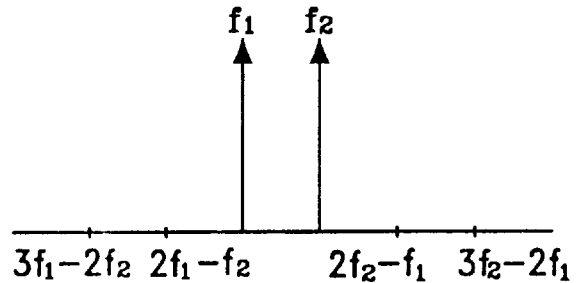
FIGS. 7A through 7G are graphical representations showing the characteristics of the signal spectrum relating to the operation of an embodiment of a combined linear power amplifying device according to the present invention.
Figure 7B:
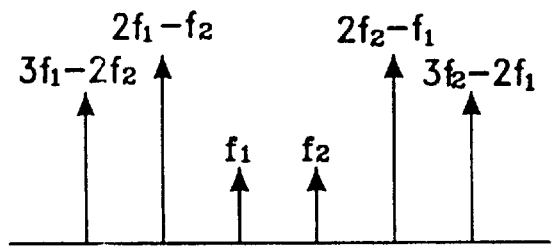
Figure 7C:
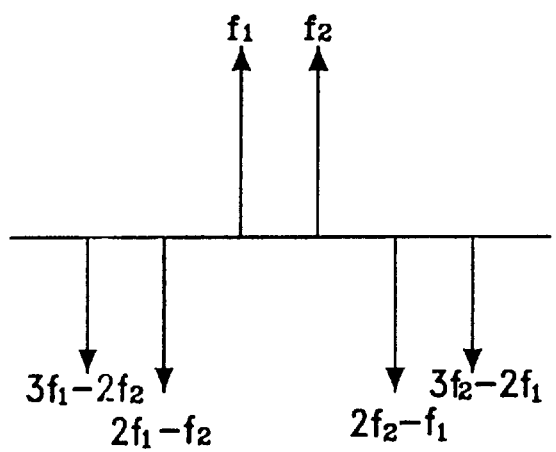
Figure 7D:
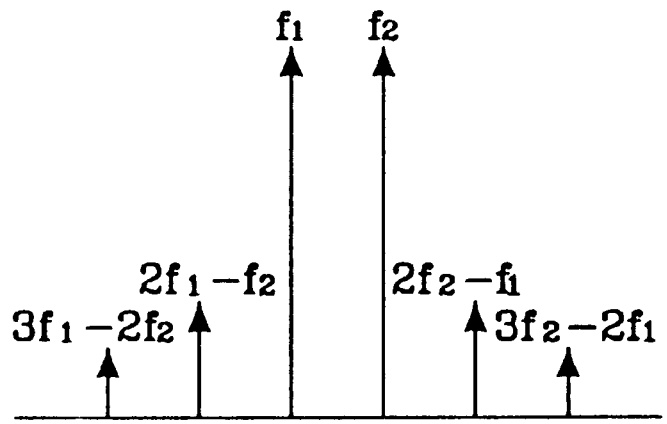
Figure 7E:
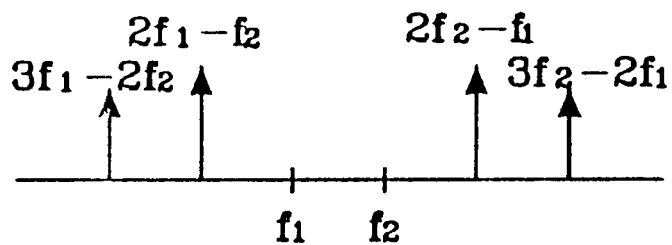
Figure 7F:
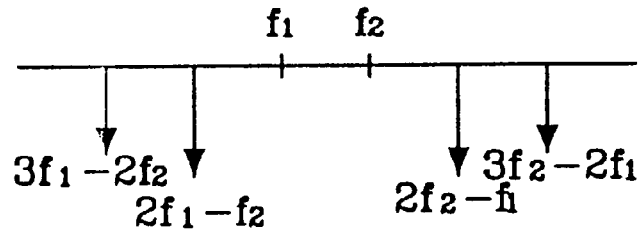
Figure 7G:
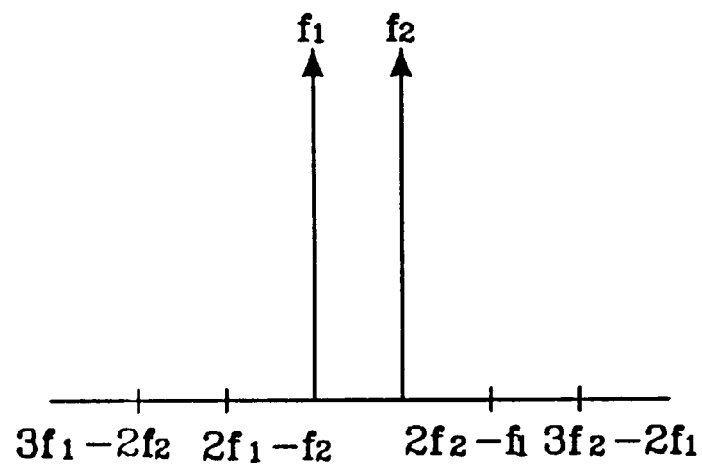

FIGS. 7A through 7G are views showing the characteristics of the signal spectrum corresponding to the operation of the linear power amplifying device according to the embodiment of the present invention as shown in FIG. 3, which are illustrated through the assumption of two tones. That is, FIG. 7A depicts the RF input signal, FIG. 7B depicts a harmonics signal of the RF signal generated in a harmonic generator 314 (FIG. 4), FIG. 7C depicts a signal where the size of the harmonics can be adjusted by a variable attenuator 315 (FIG. 4) in the predistortor 213 and the phase thereof can be adjusted to be capable of being inputted with opposite phase of the high power amplifier 214 by means of a variable phase shift 316 (FIG. 4), and FIG. 7D depicts the amplified RF signal containing the intermodulation distortion signal by amplifying the predistortion signal input to the high power amplifier 214 as shown in FIG. 7C. Also, FIG. 7E depicts the intermodulation distortion signal extracted by canceling the signal component as illustrated in FIG. 7C, in the amplifying RF signal RF as shown in FIG. 7A in the signal canceler 219, FIG. 7F depicts the signal which has the adjusted size of the intermodulation distortion signal as shown in FIG. 7E and has its opposite phase with the output of the high power amplifier 214 as shown in FIG. 7D, and FIG. 7G depicts a finally-outputted signal which suppresses the intermodulation distortion signal by coupling the intermodulation distortion signal extracted, as shown in FIG. 7D, and the amplifying RF signal, as shown in FIG. 7D, to each other with opposite phase.

Figure 4:
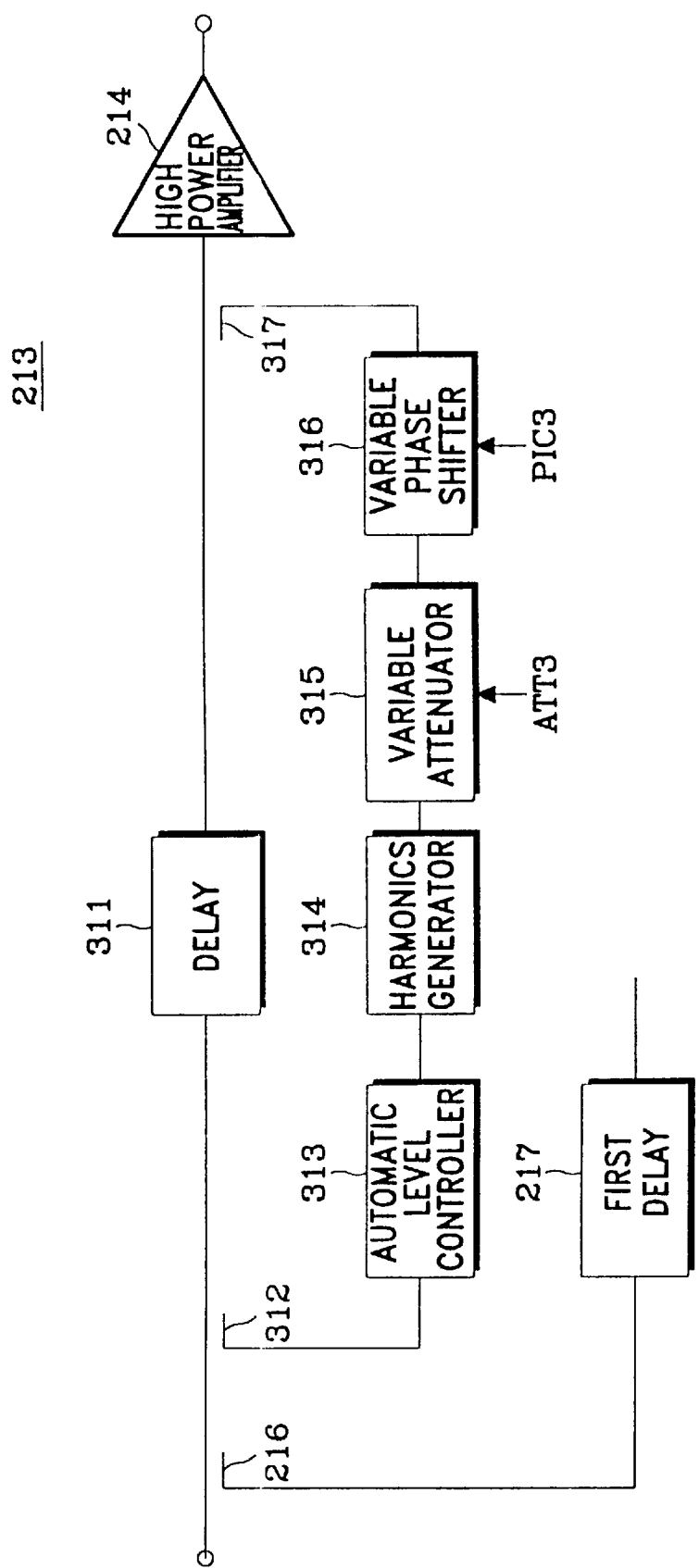
FIG. 4 is a schematic/block diagram showing an embodiment of the predistortor of FIG. 3.

FIG. 4 is a schematic/block diagram showing an embodiment of the predistortor 213 of FIG. 3. With reference to FIG. 4, the power divider 312 positioned at the input terminal divides the RF signal and outputs the divided RF signal. An automatic level controller (ALC) 313 constantly maintains the level of the RF signal input thereto in order to generate constant harmonics regardless of the variation of the level of the RF signal input thereto. The harmonics generator 314 receives the RF signal, whose level is adjusted in the automatic level controller 313, and generates third, fifth, seventh, and higher harmonics of the RF signal. The variable attenuator 315 receives the harmonics signal output from the harmonics generator 314 and controls the gain of the harmonics component via the attenuation control signal ATT3 output by the controller 237 (FIG. 3). The variable phase shifter 316 receives the harmonics signal output from the harmonics generator 314, adjusts the phase of the harmonics component via the phase control signal PIC3 output from the controller 237 and outputs the adjusted phase. A second delay 311 delays the RF signal input through the main path during the period of time when the predistortion signal occurs. A signal coupler 317 is positioned between the output terminal of the second delay 311 and the input terminal of the high power amplifier 214, thereby coupling the predistortion signal to the delayed RF signal.

Referring to FIG. 4, the harmonics generator 314 is constructed with a signal coupler and a Schottky diode. Then, upon the RF signal being input to the Schottky diode, the Schottky diode generates the high harmonics in accordance with the level of the input RF signal. Consequently, the level of the RF signal input to the Schottky diode should be set to a desired level capable of suppressing the intermodulation distortion signal included in the output of the high power amplifier 214. To meet this requirement, the automatic level controller 313 is positioned before the harmonics generator 314 so that the RF signal can always be input with the given level. The automatic level controller 313 controls and outputs the RF signal of the given level set regardless of the variation of the level of the RF signal input to the linear power amplifier.

Figure 5:
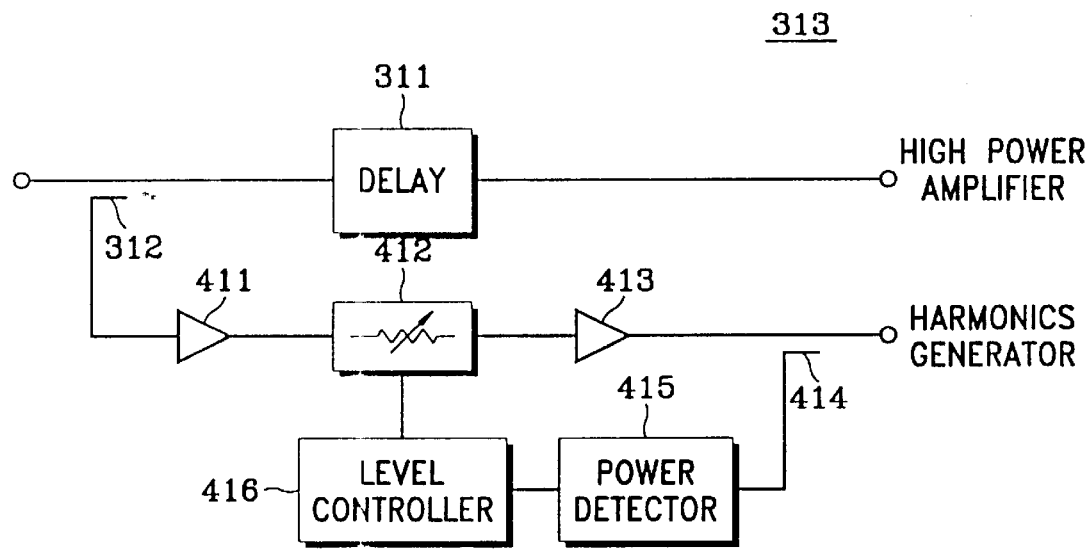
FIG. 5 is a schematic/block diagram showing an embodiment of the automatic level controller of FIG. 4.

FIG. 5 is a schematic/block diagram showing an embodiment of the automatic level controller 313 of FIG. 4, where a variable attenuator 412 is connected between the power divider 312 and the harmonic generator 314. Further, a power divider 414 is disposed at the input terminal of the harmonics generator 314, which divides and outputs the RF signal having the adjusted level being applied to the harmonic generator 314. Still further, a power detector 415 converts the RF signal received from the power divider 414 into a DC voltage and thus outputs the converted signal to a level controller 416. The level controller 416 controls the variable attenuator 412 according to the DC voltage provided to the power detector 415, so that the RF signal, always having the given signal level, can be input to the harmonics generator 314.

Figure 6:
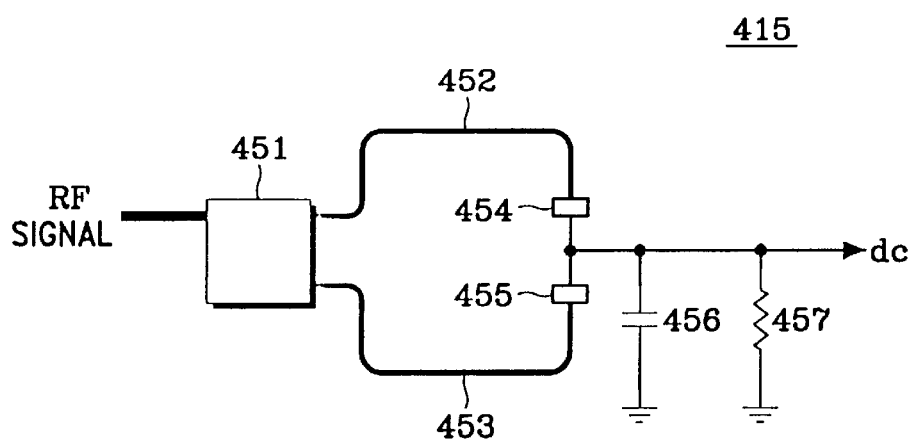
FIG. 6 is a schematic/block diagram showing an embodiment of the power detector of FIG. 5.

Herein, the power detector 415, as will be explained in the context of FIG. 6, should sense the multi-carrier of the RF signal. Namely, the power detector 415 should receive the RF signal for the multi-carrier and convert the input RF signal into the DC voltage. FIG. 6 is a schematic/block diagram showing an embodiment of the power detector 415 of FIG. 5, where an RF transformer 451 receives the RF signal and generates two signals having a phase difference of 180° with respect to each other. The two out-of-phase signals output from the RF transformer 451 are converted by transmitting lines 452 and 453 and Schottky diodes 454 and 455 into the DC level. The DC voltage signal is then filtered through a capacitor 456 and a resistor 457, and then output from the power detector 415 as a filtered DC voltage signal.

With reference to FIGS. 5 and 6, regarding the operation of controlling the level of the input RF signal, the RF transformer 451 for generating the signals having a phase difference of 180° generates and outputs two signals by separating the input RF signal by a half cycle or period. Further, the Schottky diodes 454 and 455 convert the two signals input via the transmitting lines 452 and 453 into the DC level, respectively. Accordingly, the average power of the multi-carrier can be sensed without error, so that the level of the RF signal input to the harmonics generator 314 can be precisely converted into the DC voltage.

At this point, the level controller 416 generates a control signal depending on the level of the DC voltage of the RF signal output from the power detector 415 and applies the generated control signal to the variable attenuator 412. The automatic level controller 313 can be embodied by using an operational amplifier. At this time, the control signal output from the automatic level controller 313 is generated to perform more attenuation control when the DC voltage increases and to perform less attenuation control upon the DC voltage decreasing. Thus, the variable attenuator 412 variably attenuates the RF signal to maintain the given level regardless of the level of the input RF signal and inputs the attenuated signal to the harmonics generator 314.

Then, when the variation of the level of the input RF signal is 10 dB, the operation region of the automatic level controller 313 should be designed to control its level above 10 db, at a minimum. In addition, the output level of the RF signal of the automatic level controller 313 should be set to optimally suppress the intermodulation distortion signal which the harmonic generator 314 generates in the high power amplifier 214, as the predistortion signal. Therefore, since the harmonic generator 314, which receives the output of the automatic level controller 313, receives the RF signal of the given level, the harmonics can stably occur. As well, inasmuch as the harmonics output in the harmonics generator 314 are input to the high power amplifier 214 by being coupled with the RF signal, the high power amplifier 214 can prevent the generation of the intermodulation distortion signal in the course of amplifying the RF signal.

Likewise, upon being input to the high power amplifier 214, the harmonics generated as above should has the adjusted size and opposite phase of the harmonics capable of being generated in the amplification process. The variable attenuator 315 and the variable phase shifter 315, as shown in FIG. 4, adjust the size of the harmonics generated as much as the size of the intermodulation distortion signal capable of being generated in the amplification process and adjust the phase to be opposite in phase to the harmonics having the adjusted size.

The controller 237 controls the signal selector 235, selects the output of the high power amplifier 214 which is output from the power divider 232, controls the signal detector 236, and detects the RSSI of the intermodulation distortion signal in the output of the high power amplifier 214 as shown in FIG. 7D. After comparing and analyzing the RSSI value of the intermodulation distortion signal outputted from the signal detector 236 with the RSSI value of the previous state, the controller 237 generates the attenuation control signal ATT3 and the phase control signal PIC3 so as to control the suppression of the intermodulation distortion signal to be performed smoothly by the high power amplifier 214.

Then, the variable attenuator 315 adjusts the size of the predistortion signal generated from the harmonics generator 315 via the attenuation control signal ATT3, and the variable phase shifter 316 adjusts the phase in response to the phase control signal PIC3 so that the predistortion signal can be input with opposite phase to the high power amplifier 214. As adjusted above, the harmonics signal as shown in FIG. 7D, which is generated from the harmonics generator 314, has its adjusted size and phase, and the signal coupler 317 couples the intermodulation distortion signal to the input terminal of the high power amplifier 214. At this time, as shown in FIG. 7A, the delay unit 311 for delaying the inputted RF signal, delays the RF signal until the predistortion signal is coupled to the input terminal of the high power amplifier 214. Thereafter, it is understood that the predistortion signal is coupled to the input terminal of the high power amplifier 214. Here, it is preferable to adjust, with opposite phase, the intermodulation distortion signal coupled to the RF signal, as shown in FIG. 7C, to the input terminal of the power transistor of the high power amplifier 214.

As noted above, the predistortor 213 anticipates the intermodulation distortion signal to be generated in the high power amplifier 214 to thereby generate the predistortion signal, and controls the phase and attenuation of the harmonics to prevent the intermodulation distortion signal from being generated at the maximum value, thereby inputting the controlled attenuation and phase to the high power amplifier 214. In this event, the predistortor 213 mainly eliminates the third harmonics generated with highest level among the harmonics capable of being generated in the high power amplifier 214. The effect in eliminating the intermodulation distortion signal by utilizing the predistortion operation can reduce the load more so than can be accomplished solely by eliminating the intermodulation distortion signal by adapting the feedforward operation. Inasmuch as the adjustment of the feedforward system is very fine and difficult, the predistortion system is advantageous in consideration of the improvement of a number of dB.

However, after first suppressing the intermodulation distortion signal which is generated in the high power amplifier 214 by the predistortion operation, as mentioned previously, the intermodulation distortion signal which is not always possible to be suppressed even by the predistortion system may then be suppressed by the feedforward operation. In the above feedforward operation, the process for reducing the intermodulation distortion signal of the high power amplifier 214 is largely divided into two steps. The first step is to extract the pure intermodulation distortion signal distortion by canceling the input RF signal and the output of the high power amplifier 214. The other step is to cancel the intermodulation distortion component in the output of the high power amplifier 214 after correcting the size and the phase of the extracted intermodulation distortion signal, so as to reduce the intermodulation distortion signal included in the signal which is finally output in the high power amplifier in a distortion-free manner.

A detailed explanation of the first step of the feedforward operation will now be given. The power divider 216 on the sub-path divides the RF signal inputted as shown in FIG. 7A in the sub-path, and the first delay unit 217 delays the RF signal divided in the power divider 216 during the time when the predistortion and RF amplification are performed, thereby applying the delayed signal to the signal canceler 219. Thus, the RF signal component as shown in FIG. 7A, which is outputted from the first delay 217, is reciprocally canceled with the RF signal component of the amplifying signal as shown in FIG. 7D, which is divided in the power divider 218, so as to extract and output the pure intermodulation distortion signal component.

As mentioned hereinbefore, the signal canceler 219 as the core component of the feedforward system, detects only the intermodulation distortion signal component in the high power amplifier 214. The signal canceler 219 can be constructed as a subtractor or an adder. In the case of constructing the signal canceler 219 as the subtractor, two RF signals to be input should be adjusted to have the same phase with each other. Also, in the case of constructing the signal canceler 219 as the adder, the two RF signals to be input should be adjusted to have opposite phase with respect to each other. In a preferred embodiment of the present invention, the signal canceler 219 is embodied as the subtractor. In this case, the subtractor has a signal coupler in an interior thereof, inputs one signal of two RF signals to be input, to the signal coupler while having the same phase with the other signal, and converts the other signal thereof to have the opposite phase with respect to the one signal, thereby inputting the converted signal to the signal coupler. When the RF signal, as illustrated in FIG. 7A, and the RF signal amplified, as illustrated in FIG. 7D, are input to the signal canceler 219 embodied as the subtractor, the two RF signals having their phases equal to each other, are converted to have opposite phases with respect to each other in an interior of the signal canceler 219. After that, the RF signal is canceled while passing the signal coupler (herein, a Wilkinson combiner can be used), thereby leaving the pure intermodulation distortion signal component.

At this point, each of levels and phases of the two RF signals input to the signal canceler 219 can be exactly equal to each other. To meet this requirement, the amplified RF signal output by the high power amplifier 214 of the main path and the RF signal to be input via the sub-path should be precisely accorded with each other in the group delay of the bandpass as well as the characteristic of the flatness of the delay should be positive. That is, it is preferable that the phase distortion of the RF signal desired to be canceled should be maximally prevented from being generated.

As described above, when the level and the phase of the RF signal outputted in the first delay 217 and the output of the high power amplifier 214 are not exactly accorded with each other, the RF signal component is not precisely canceled in the signal canceler 219. To remove the foregoing, the first variable attenuator 211 of FIG. 3 adjusts the level of the RF signal input by the attenuation control signal ATT1 output by the controller 237 and the second variable phase shifter 212 thereof adjusts the phase of the RF signal input by the phase control signal PIC1 which is output from the controller 237. Accordingly, the first variable attenuator 211 and the second variable phase shifter 212, respectively, adjust to accord the phase and the level of the RF signal of the sub-path with those of the RF signal of the main path. Thus, the signal canceler 219 cancels two RF signals input while having the same level and phase with each other.

As mentioned previously, for the sake of controlling the phases and the levels of the two RF signals, the controller 237 outputs the first selection signal SELL for selection of a third signal SF3 to the signal selector 235 and outputs the control data PCD for detection of the RSSI of the RF signal component of the third signal SF3 in the signal detector 236. As a consequence, the signal selector 235 selectively inputs the third signal SF3 as the output of the signal canceler 219, the output of the signal selector 219 being divided in the power divider 233, and the signal detector 236 generates the RSSI which converts the RF signal component of the third signal SF3 into the DC voltage. Then, the controller 237 generates the attenuation control signal ATT1 and the phase control signal PIC1 for attenuation of the RF signal component in the signal canceler 219 after comparing and analyzing the RSSI of the RF signal component with the RSSI of the previous RF signal.

And then, the first variable attenuator 211 attenuates the input RF signal input by determining the attenuation ratio by way of the attenuation control signal ATT1, and the first variable phase shifter 212 adjusts the phase of the input RF signal by the phase control signal PIC1. Here, since the attenuation control signal ATT1 and the phase control signal PIC1 are generated after comparing and analyzing the RSSI of the RF signal to be output in the signal canceler 219 and the RSSI of the previous RF signal with each other, the first variable attenuator 211 and the first variable phase shifter 212 control two RF signals, as shown in FIGS. 7D and 7A, so that the above RF signals can have the same phases and levels with each other, finally.

The reason for canceling the RF signal distortion in the signal canceler 219, as stated before, is to have no influence on the error amplifier 222 positioned in the back terminal by greatly suppressing the RF signal and solely extracting the intermodulation distortion signal component. Namely, if the output of the signal canceler 219 is changed and thus, the RF signal can not be effectively eliminated, the RF signal having the relatively large level is input to the error amplifier 222, thereby causing damage to the error amplifier 222 accordingly.

Next, a detailed explanation of the second step of the feedforward operation will be given hereinafter. Therein, the phase and level of the intermodulation distortion signal output from the signal canceler 219, as above, are adjusted through the second variable attenuator 220, the second variable phase shifter 221, and the error amplifier 222, and the intermodulation distortion signal component included in the output of the high power amplifier 214 is removed by being input to the main path. At this time, the intermodulation distortion signal coupled by the signal coupler 223 should be opposite in phase to the amplified and output signal.

Here, in order to correct the intermodulation distortion signal detected in the signal canceler 219 to have its level equal to the level of the intermodulation distortion signal included in the output of the high power amplifier 214 in the main-path and to have an opposite phase with respect to the intermodulation distortion signal included therein, the controller 237 generates the first selection signal SELL for selecting the fourth signal SF4 as the finally-outputted signal which is divided in the power divider 234 and outputs the control data PCD for detection of the RSSI of the harmonics as the intermodulation distortion signal of the fourth signal SF4. Thus, the signal selector 235 selectively outputs the fourth signal SF4 outputted from the power divider 234 via the first selection signal SEL1 and, the signal detector 236 detects the RSSI of the harmonics of the fourth signal SF4 by the control data PCD and applies the detected RSSI to the controller 237. The controller 237 compares and analyses the RSSI of the intermodulation distortion signal included in the finally-outputted signal with the RSSI of the previous intermodulation distortion signal, so that the attenuation control signal ATT2 and the phase control signal PIC2 for suppression of the intermodulation distortion signal included in the finally-outputted signal can be generated depending on the above analyzed result.

Therefore, the second variable attenuator 220, receiving the output of the signal canceler 219, adjusts the level of the intermodulation distortion signal via the attenuation control signal ATT2, and the second variable phase shifter 221, receiving the signal output from the second variable attenuator 220, adjusts the phase of the intermodulation distortion signal which is input in response to the phase control signal PIC2. At this moment, the second variable phase shifter 221 is controlled to enable the intermodulation distortion signal to have an opposite phase in the signal coupler 223 by means of the phase control signal PIC2. Thus, the error amplifier 222, connected between the second variable phase shifter 221 and the signal coupler 223, amplifies and outputs the intermodulation distortion signal which has the level and the phase adjusted, as above.

As discussed above, the linear power amplifying device 10 according to the present invention, uses the feedforward system and the predistortion system in order to suppress the intermodulation distortion signal belonging to the amplifying signal. For the sake of suppressing the intermodulation distortion signal, the intermodulation distortion signal capable of being generated in the high power amplifier 214 is beforehand suppressed by using the predistortion system and then the intermodulation distortion signal included in the output of the high power amplifier 214 is detected by using the feedforward system, thereby coupling the above detected signal to the finally-outputted signal and removing the intermodulation distortion signal in a sequential manner. In the case of eliminating the intermodulation distortion signal with only using the feedforward system, because it is difficult to design and construct the high power amplifier 214 and the error amplifier 222 and the exact turning of the high power amplifier 214 and the error amplifier 222 is difficult, the intermodulation distortion signal of the given size is first suppressed by using the predistortor 213 and the rest of the intermodulation distortion signal is eliminated by using the feedforward system. Due to that, the design and construction of the linear power amplifier can be facilitated.

Next, the process of suppressing the intermodulation distortion signal by using the feedforward system and the predistortion system, focusing on the controller 237, will now be described.

Figure 8:
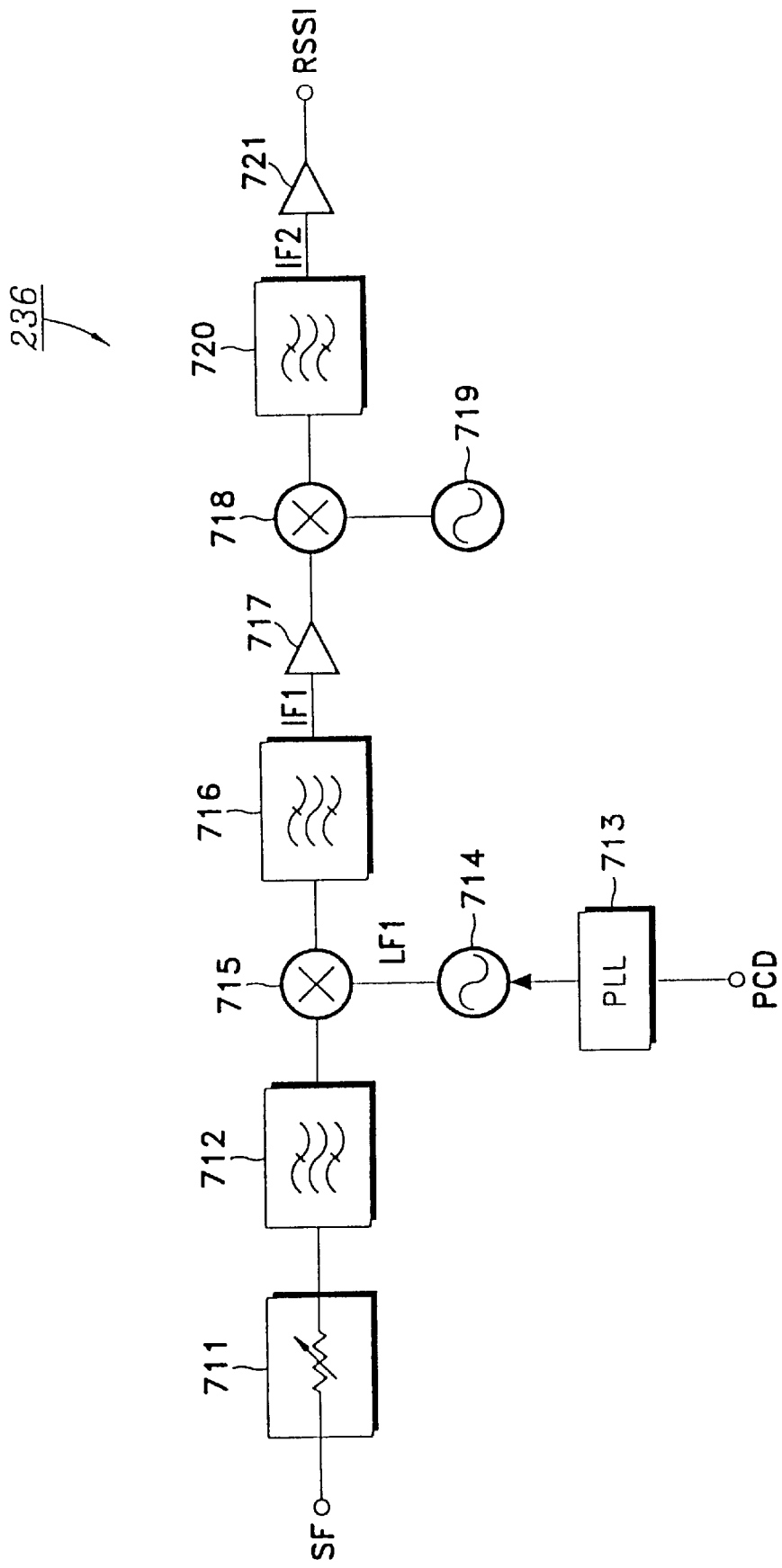
FIG. 8 is a schematic/block diagram showing an embodiment of the signal detector of FIG. 3.

FIG. 8 is a schematic/block diagram showing an embodiment of the signal detector 236 of FIG. 3, according to the present invention. With regard to FIG. 8, an attenuator 711 attenuates and outputs an SF signal output from the signal selector 235. A filter 712, functioning as a wide bandpass filter, filters the signal of the transmitting bandpass. A phase lock loop (PLL) 713 and an oscillator 714 generate a corresponding local frequency LF1 by the control data PCD output by the controller 237. The above local frequency LF1 is employed to determine the frequency for detecting the RSSI of the selected SF signal. A mixer 715 mixes the signal output in the filter 712 with the local frequency LF1 and thus generates an intermediate frequency IF. A filter 716, as an intermediate frequency filter, filters a subtraction signal |SF-LF1| of two frequencies in the output of the mixer 715, thereby generating the filtered signal as an intermediate frequency IF1. An intermediate frequency amplifier 717 amplifies and outputs the intermediate frequency IF1. An oscillator 719 generates the fixed local frequency LF2. The mixer 718 mixes the intermediate frequency IF1 outputted from the intermediate frequency amplifier 717 and the local frequency LF2 to then generate the intermediate frequency IF2. A filter 720 filters a subtraction signal |IF-LF2| of two frequencies in the output of the mixer 718 and outputs the filtered signal as the local frequency LF2. A log amplifier 712 converts the intermediate frequency IF2 outputted in the filter 720 into a DC voltage and generates the converted voltage as an RSSI signal.

Regarding the operation of the signal detector 236 of FIG. 8, the signal selector 235 selectively outputs the corresponding RF signal among the first signal SF1 to the fourth signal SF4 by the first selection signal SELL of the controller 237. Thus, the filter 712 of the signal detector 236 filters the signal SF and applies the filtered signal SF to the mixer 715. And then, the PLL 713 and the oscillator 714 generate the local frequency LF1 for selection of the RF signal or the harmonics of the signal selected by the control data PCD of the controller 237. Consequently, the mixer 715 mixedly outputs the signals SF and the local frequency LF1 and the filter 716 filters the frequency corresponding to the subtraction between two signals and outputs the filtered frequency as the intermediate frequency IF1. The construction as described above determines the frequency for detection of the RSSI in the selected signal SF and performs the frequency down conversion of the first step, at the same time.

The mixer 715 mixes the local frequency LF2 outputted in the oscillator 719 and the intermediate frequency IF1 and the filter 720 filters the frequency corresponding to the subtraction between the intermediate frequency IF1 and the local frequency LF2 of the mixed signals, thereby outputting the filtered frequency as the intermediate frequency IF2. The frequency down conversion of the second step is performed via the above construction. The log amplifier 721 inputs the intermediate frequency IF2, converts the inputted intermediate frequency IF2 into the DC voltage to be outputted. Herein, the outputted signal becomes the RSSI.

Figure 9:
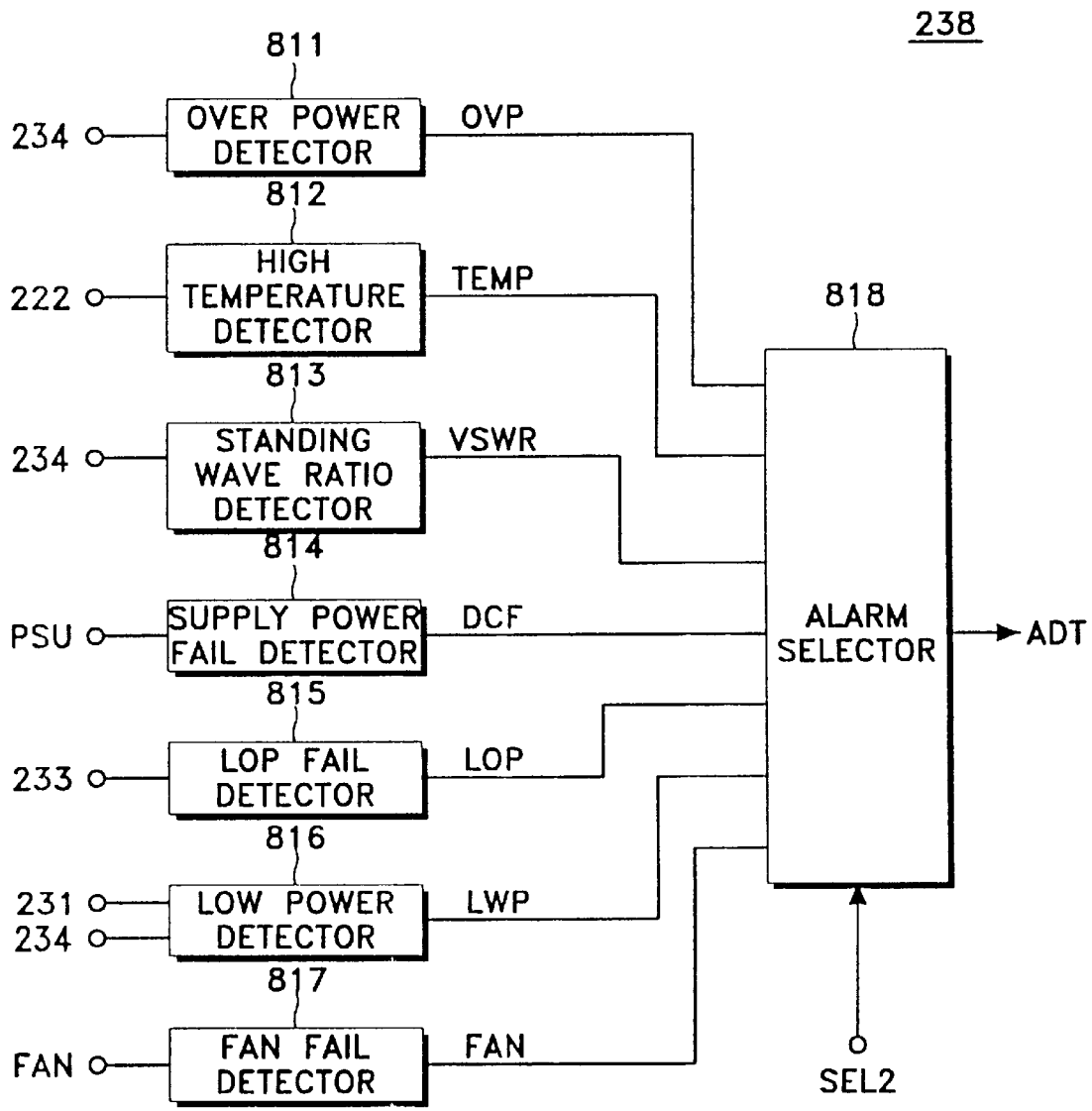
FIG. 9 is a schematic/block diagram showing an embodiment of the alarm detector of FIG. 3.

FIG. 9 is a schematic/block diagram showing an embodiment of an alarm detector of FIG. 3, which is to detect the alarm (failed or abnormal) state of the linear power amplifier LPAn according to the present invention. In FIG. 9, an over power condition detector 811 inputs the final output of the linear power amplifier LPAn divided in a power divider 234. Also, the over power condition detector 811 compares the power of the above finally-outputted RF signal with a set reference value and, upon the above finally-outputted RF signal being greater than the set reference value, the detector 811 sets an over power condition detection signal OVP. A high temperature condition detector 812 is comprised of a temperature sensor, the temperature sensor being located in the vicinity of the error amplifier 222. The high temperature condition detector 812 senses an internal temperature of the linear power amplifier LPAn and thus, if the sensed temperature is over a set temperature, the detector 812 sets a high temperature condition detection signal TEMP. A standing wave ratio condition detector 813 is connected with the power divider 234, and compares and analyzes the difference between the voltage and the reflective voltage output by the linear power amplifier LPAn, and, in the case that the standing wave ratio is over a predetermined ratio, the detector 813 sets a standing wave ratio condition detection signal VSWR.

A supply power fail condition detector 814 detects the supply power generated in a power supply unit (hereinafter, referred to as PSU) and sets a power supply condition detection signal DCF in the case of the generation of the failed abnormal state of the linear power amplifier LPAn. A loop fail condition detector 815 coupled to the power divider 233, detects the output of the signal canceler 219 and sets a loop fail condition signal LOP upon the RF signal having the value over a predetermined value is detected. A low power condition detector 816 inputs the outputs of the power dividers 231 and 234, and sets a low power condition detection signal LWP in the event that the difference of the power between the input RF signal and the output RF signal is below a predetermined value. A fan fail condition detector 817 detects the driving state of the fan disposed at a rear surface of the linear power amplifier LPAn and generates a fan fail condition signal FAN upon generation of the failed state of the linear power amplifier LPAn.

An alarm condition selector 818 inputs the outputs of the above detectors, more precisely, the over power condition detector 811, the high temperature condition detector 812, the standing wave ratio condition detector 813, the supply power fail condition detector 814, the loop fail condition detector 815, the low power condition detector 816, and the fan fail condition detector 817, and selectively outputs the corresponding detection signal in response to the second selection signal SEL2 output by in the controller 237.

Figure 10:
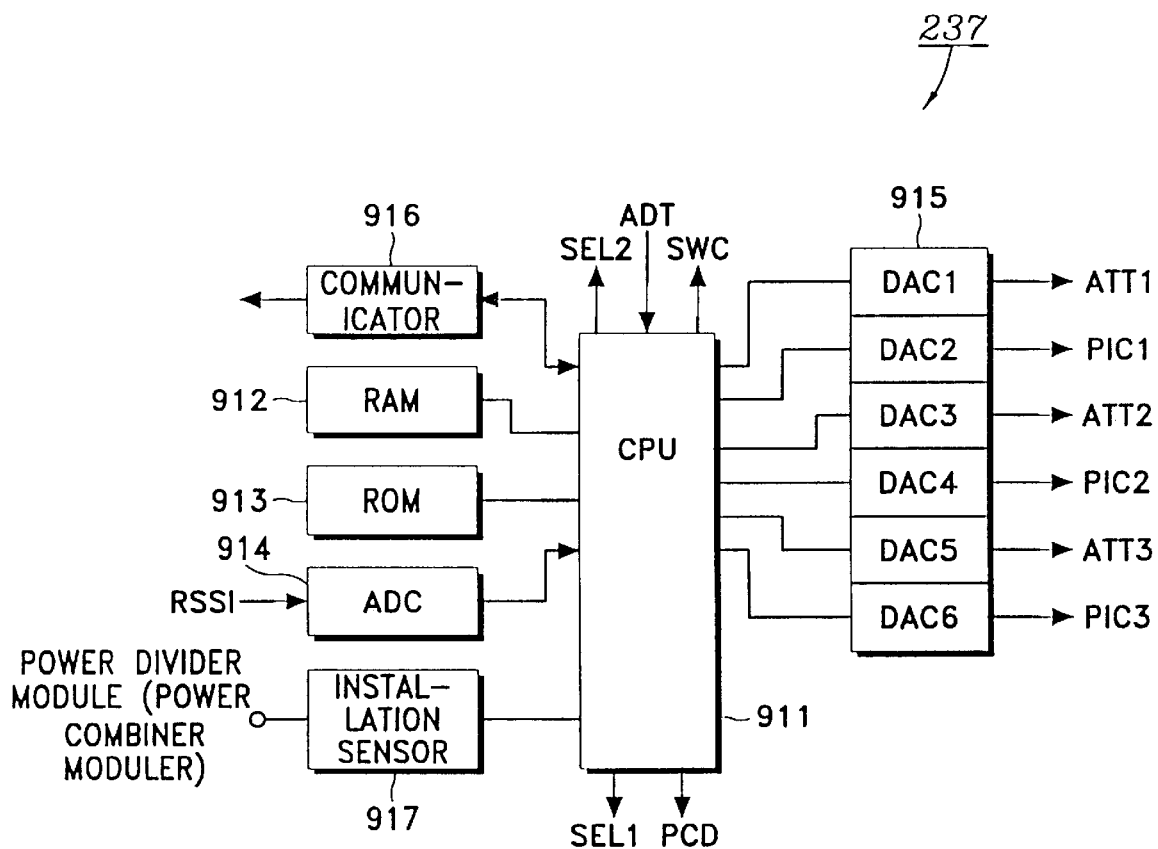
FIG. 10 is a schematic/block diagram showing an embodiment of the controller of FIG. 3.

FIG. 10 is a schematic/block diagram showing an embodiment of the controller 237 of FIG. 3, which includes an analog-to-digital converter 914 (ADC) for converting the RSSI output by the signal detector 236 into digital data to be output; a read only memory 912 (ROM) for storing a program for controlling the attenuation and the phase in accordance with an embodiment of the present invention; a central processing unit 911 (CPU) for generating the control data PCD for selection of the frequency to select the desired RSSI in the selected signal SF and the first selection signal SELL for selection of the signal SF depending on the program in the ROM 912, and generating the attenuation control signals ATT and the phase control signals PIC after comparing and analyzing the RSSIs output by the ADC 914 with each other; a random access memory 913 (RAM) for temporarily storing data which is generated in the process of performing the program; a digital-to-analog converter 915 (DAC) for converting the attenuation control data and the phase control data output by the CPU 911 into analog data and outputs the converted data as the attenuation control signals ATT and the phase control signals PIC; and a communicator 916 which performs the communication function with the linear power amplifying device under the control of the CPU 916 for a long time. Thereinafter, the CPU 911 further outputs the second selection signal SEL2 to the alarm detector 238 over a regular period of time, inputs the detection signals output from the alarm detector 238 in a sequential manner, detects the states of the detection signals, and thus, if the failed state exists over a predetermined time, the CPU 911 generates the switching control signal SWC for turning off the RF switches of the power divider module 100 and the power combiner module 300. Upon installation of the linear power amplifier LPAn to the power divider module 100 and the power combiner module 300, an installation sensor 917 receives the output signals from the power divider module 100 and the power combiner module 300, to generate an installation sensing signal. The installation sensor 917 may be composed of a connector, and it is assumed in the embodiment of the present invention that upon installation of the linear power amplifier LPA, the installation sensor 917 is connected to ground terminals of the power divider module 100 and the power combiner module 300. Therefore, the installation sensing signal becomes the ground signal. Further, the installation sensor 917 generates an "open" signal when the linear power amplifier LPAn is not connected to the power divider module 100 and the power combiner module 300.

FIGS. 11A through 11G are flow charts showing operation processes of the combined linear power amplifying device according to a first embodiment of the present invention. In the above embodiment of the present invention, the controller 237 checks the outputs of the detectors 811 to 817 at a first set period of time, detects existence/nonexistence of the generation of the failed state, and sets an alarm flag corresponding to the generation of the failed state. Further, the controller 237 checks whether or not the corresponding alarm which caused the alarm flag to be set lasts for a second set period of time, and if so, that is, if the alarm flag is set for the second set period of time, the controller 237 opens the RF switches connected to the linear power amplifier LPAn and terminates the operation of the linear power amplifier LPAn. After that, when a third set period of time passes in the state where the operation of the linear power amplifier LPAn is terminated (due to the RF switches being opened), the controller 237 then closes the RF switches and restarts the operation of the corresponding linear power amplifier LPAn. The controller 237 repeatedly performs the above operations, and again completely stops the driving of the linear power amplifier LPAn upon the alarm state being maintained over the given first period of time again.

Figure 11A:
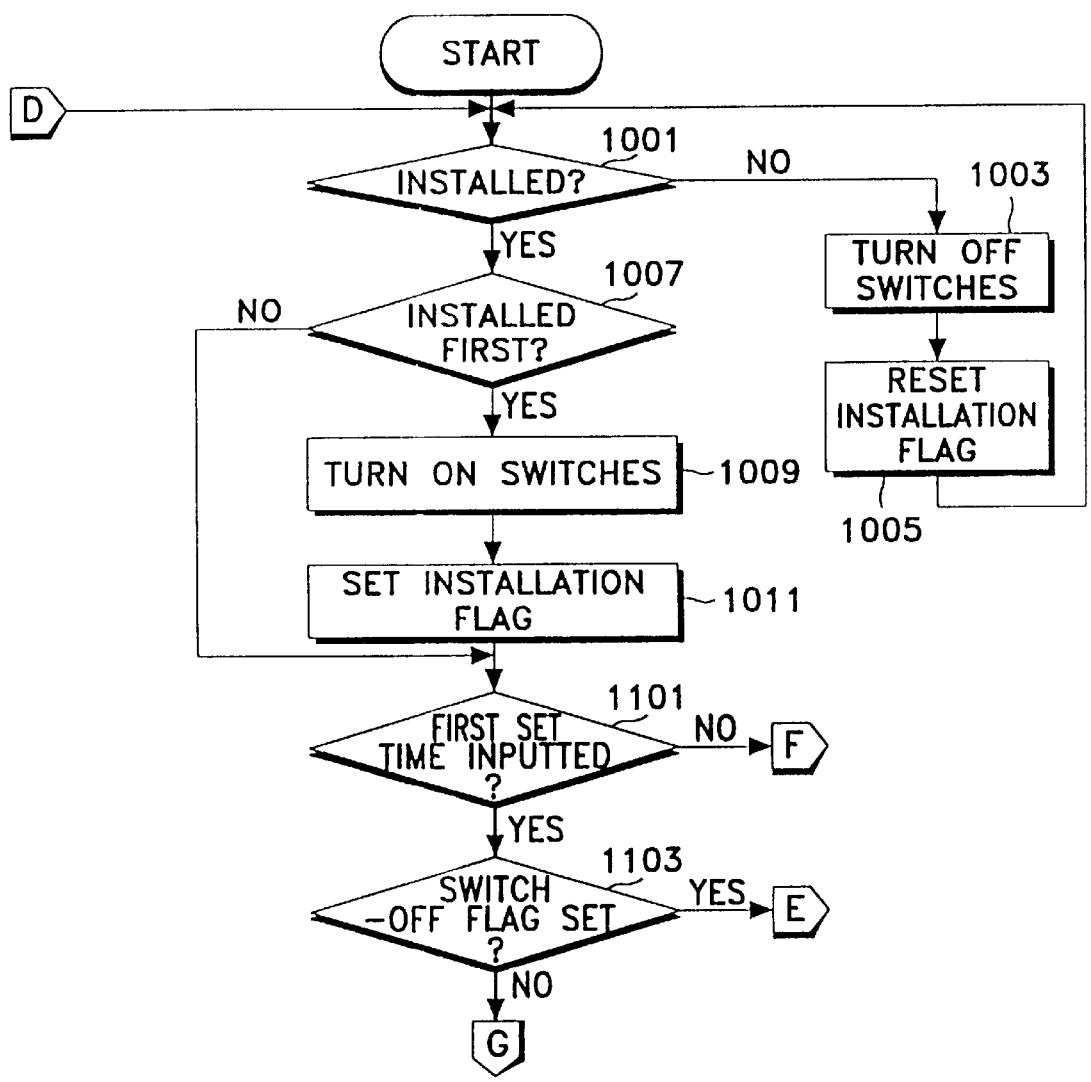
FIGS. 11A through 11G are flow charts showing operation processes of an embodiment of a combined linear power amplifying device according to the present invention.

With reference to FIG. 11A, the CPU 911 checks, in step 1001, whether the linear power amplifier LPAn is installed in the power divider module 100 and the power combiner module 300 by examining an output of the installation sensor 917. At this moment, if the installation sensor 917 generates a non-installation sensing signal, the CPU 911 opens the switches SWI and SWO, in step 1003 and then, resets an installation flag, in step 1005. However, if the installation sensor 917 generates an installation sensing signal, the CPU 911 checks, in step 1007, whether the linear power amplifier LPAn is installed first or not. If so, the CPU 911 turns on the RF switch SWI connected to the power divider module 100 and the RF switch SWO connected to the power combiner module 300, in step 1009 and then, sets the installation flag, in step 1011. Thereinafter, the CPU 911 proceeds to step 1101 to check whether the alarm is detected or not. Furthermore, upon installation of the linear power amplifier LPAn, the CPU 911 turns on the RF switches SWI and SWO and performs a normal linear power amplifying function.

Now, description will be made on a process for checking an operation state of the linear power amplifier LPAn. The CPU 911 checks, in the step 1101, whether or not the first set time is set from an internal timer and thus, when checked that the first set time was set therefrom, checks, in step 1103, whether or not a switch-off flag is set. At this moment, when checked that the switch-off flag was not set, the linear power amplifier LPAn performs its normal operation. For this reason, the controller 237 selects the output of the detectors 811 to 817 and performs the operation for checking existence/nonexistence of the failed state.

At a first tine, in step 1113, the CPU 911 outputs the second selection signal SEL2 for selection of the output OVP of the over power condition detector 811, and the alarm selector 818 selects the output OVP of the over power condition detector 811 and outputs the selected output OVP to the CPU 911. In the case, the over power condition detector 811 inputs a fmal output signal of the linear power amplifier LPAn output by the power divider 234, compares the power of the finally-outputted RF signal with the set power value and sets the OVP signal upon the power of the RF signal being over the set power value.

Following that, after selecting the OVP signal in the above step 1113, the CPU 911 checks the state of the OVP signal. Thus, the CPU 911 checks, in step 1115, whether or not the output RF signal is in the over voltage state, and if so, namely, if checked that the output RF signal was in the over voltage state, proceeds to step 1117. Thus, the CPU 911 checks, in step 1117, whether or not the OVP flag is set. At this time, when checked that the OVP flag was not set, the CPU 911 senses that the output of the RF signal is first in the over voltage state and sets the OVP flag, in step 1119. After that, the CPU 911 activates the OVP counter for accumulating the time for detection of the over voltage state, in step 1121. However, when checked in the above step 1117 that the OVP flag was set, the CPU 911 senses that the previous state was the over voltage state, increases the OVP counter value and accumulates the time value for maintenance in the over voltage state, in step 1123.

On the other hand, when checked in the aforesaid step 1115 that the output RF signal was not in the over voltage state and the OVP signal was not set, the CPU 911 senses that the output of the linear power amplifier LPAn is not in the over voltage state. Thus, the CPU 911 clears the OVP counter value in step 1125 and the OVP counter, in step 1127.

As a consequence, in terms of the foregoing steps 1113 to 1127 as shown in FIG. 11A, the CPU 911 detects the output power of the RF signal finally-output by the linear power amplifier LPAn, detects as the over voltage state of the RF signal in the case that the above output thereof is over the set power value, accumulatively stores the time the signal is output in the over voltage state, and finally clears the OVP flag and the OVP counter for accumulatively storing the time value for being maintained as the over voltage state in case of maintaining the RF signal as the output of the normal power range.

At a second time, furthermore, the CPU 911 outputs the second selection signal SEL2 for selection of the output TEMP of the high temperature condition detector 812, in step 1131, of FIG. 11A, and the alarm selector 818 selects the output TEMP of the high temperature condition detector 811 in response to the second selection signal SEL2 and outputs the selected output to the CPU 911. At this event, the high temperature detector 812 positioned in the vicinity of the error amplifier 222, detects the internal temperature of the linear power amplifier LPAn and sets the TEMP signal upon the detected temperature being over the set temperature.

Here, the CPU 911 selectively inputs the TEMP signal and checks the existence/nonexistence of the input TEMP signal. At this time, when the TEMP signal has been set, the CPU 911 senses, in step 1133, whether or not the internal temperature of the linear power amplifier LPA is in the high temperature state and if so, i.e., if the internal temperature thereof was in the high temperature state, checks, in step 1135, whether or not the TEMP flag is set. Here, when checked in the above-mentioned step 1135 that the TEMP flag was not set, the CPU 911 recognizes that the internal temperature of the linear power amplifier LPAN is first in the high temperature state, sets the TEMP flag in step 1137 and, in step 1139, activates the TEMP counter for accumulating the time for detecting that the linear power amplifier is in the high temperature state. In the meanwhile, when checked in the above step 1135 that the TEMP flag was set, the CPU 911 recognizes that the previous state was in the high temperature state in the case that the TEMP flag was already set, and increases the TEMP counter in step 1141, thereby accumulating the time value when the internal temperature of the linear power amplifier LPAn is maintained in the high temperature state.

But, when in the foregoing step 1133 that the TEMP signal was not set, the CPU 811 senses that the internal temperature of the linear power amplifier LPAn was not in the high temperature state, clears the TEMP flag in step 1143 and the TEMP counter in step 1145.

Moreover, regarding the above-identified steps 1131 to 1145 as shown in FIG. 11A, the CPU 911 detects the internal temperature of the linear power amplifier LPAn, checks whether or not the detected internal temperature is in the higher temperature state (greater than the pre-determined temperature), accumulatively stores the time that the detected internal temperature was in a temperature state higher than the pre-determined temperature, and clears the TEMP counter for accumulatively storing the time value maintained as the high temperature state in maintaining the temperature as the temperature having the normal range.

Figure 11B:
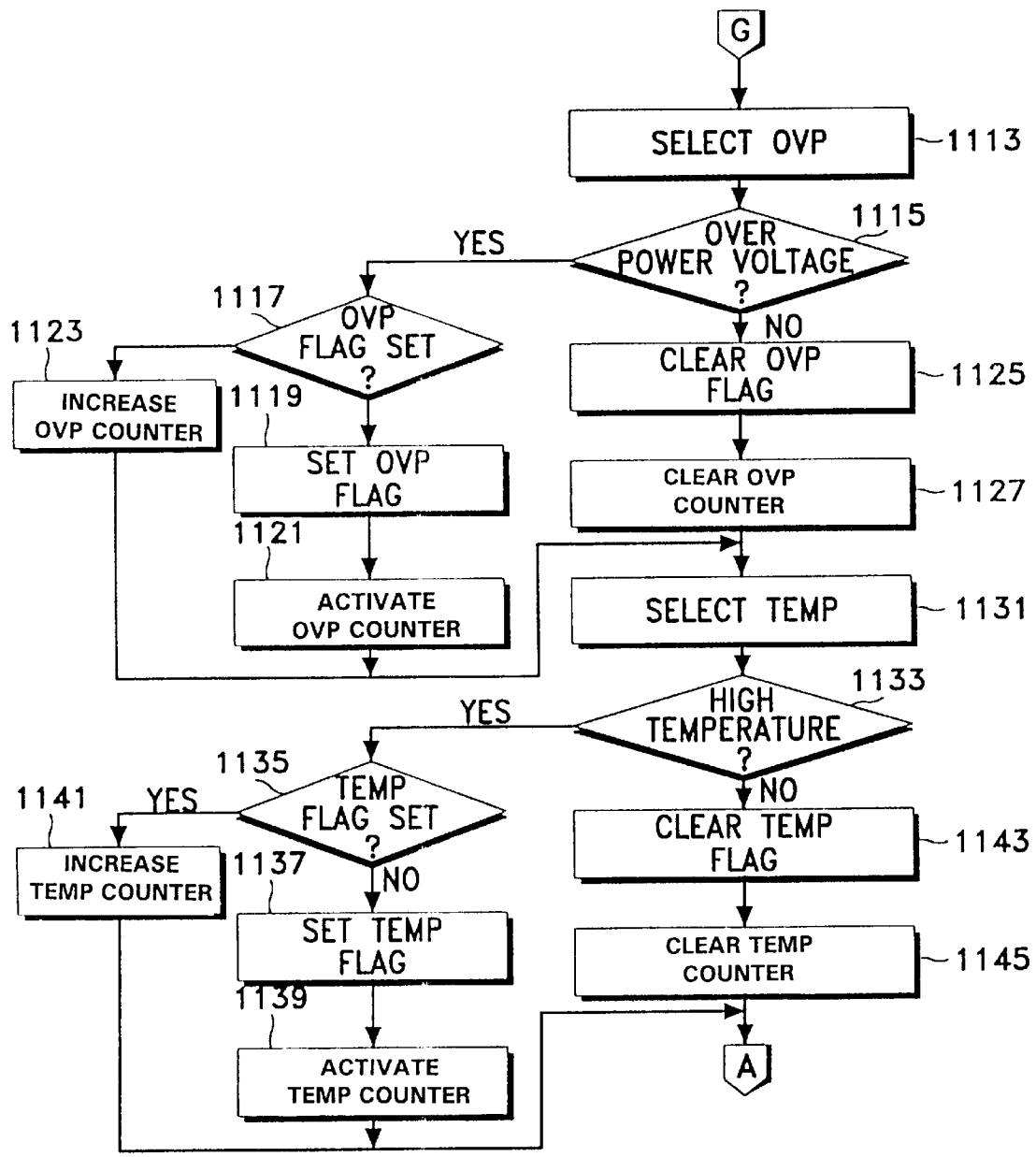

At a third time, the CPU 911 outputs the second selection signal SEL2 to select an output VSWR of the standing wave ratio detector 813, in step 1151, as illustrated in FIG. 11B and, the alarm selector 818 selects the output VSWR of the standing wave ratio detector 813 by the second selection signal SEL2 and outputs the selected output VSWR to the CPU 911. At this point, the standing wave ratio detector 813 receives the RF signal finally-output by the power divider 234, detects the difference between the output voltage and the voltage reflected in input and output terminals, and sets the VSWR signal when the difference therebetween is over the set voltage value.

Hereinbelow, as the VSWR signal was set in analyzing the state of the VSWR signal, the CPU 911 senses, in step 1153, whether or not the standing wave ratio in the output of the linear power amplifier LPAn is in the abnormal state and if so, that is, if checked that the standing wave ratio therein was in the abnormal state, checks in step 1155 whether or not the VSWR flag is set. In this occasion, when checked that the VSWR flag was not set, the CPU 911 recognizes that the standing wave ratio of the linear power amplifier LPAn is first in the failed (abnormal) state in the above step 1155, sets the VSWR flag in step 1157, and activates the VSWR counter for accumulating the time output as the abnormal state of the standing wave ratio, in step 1159. However, when checked in the above step 1155 that the VSWR flag was set, after recognizing that the previous state of the VSWR was already the abnormal state, the CPU 911 increases the VSWR counter value and accumulates the time value for outputting the standing wave ratio as the failed state, in step 1161.

Meantime, when checked in the above-referenced step 1153 that the standing wave ratio therein was not in the failed state, after sensing that the standing wave ratio of the linear power amplifier LPAn was not in the normal state, the CPU 911 clears the VSWR flag in step 1163 and the value of the VSWR counter in step 1165.

In conclusion, when observing the operations of the above said steps 1151 to 1165 as shown in FIG. 11B, the CPU 911 detects the standing wave ratio of the linear power amplifier LPAn, checks whether or not the standing wave ratio exceeds the normal range, detects the abnormal state of the standing wave ratio in the event that the standing wave ratio exceeded the normal range, accumulatively stores the time outputted as the abnormal state of the standing wave ratio, and clears the VSWR counter in the event that the standing wave ratio of the linear power amplifier LPAn did not exceed the normal range.

At a fourth time, the CPU 911 outputs the second selection signal SEL2 for selection of the output DCF of the supply power fail detector 814, in step 1171, and the alarm selector 181 selects the output DCF of the supply power fail detector 814 and outputs the selected output to the CPU 911. In this instance, the supply power fail detector 814 detects the supply power of the linear power amplifier LPAn output from the power supply unit PSU and sets the DCF signal when the detected supply power exceeds the set supply power.

After that, as the DCF signal was set in analyzing the state of the DCF signal, the CPU 911 senses, in step 1171, that the supply power supplied to the linear power amplifier LPAn was in the failed state and checks, in step 1175, whether or not the DCF flag is already set. Herein, when checked therein that the DCF flag was not set, the CPU 911 senses in the above step 1175 that the supply power supplied to the linear power amplifier LPAn was in the failed state, sets the DCF flag, in step 1177, and activates the DCF counter for accumulating the time value when the fail supply power is supplied, in step 1179. However, when checked in the above step 1175 that the DCF flag was set, the CPU 911 recognizes that the supply power in the previous state was in the failed state, increases the DCF counter value and accumulates the time value supplied as the failed state of the supply power, in step 1181.

On the other hand, when checked, in step 1173, that the DCF signal was not set, the CPU 911 senses that the supply power supplied to the linear power amplifier LPAn was in the normal state, clears the DCF flag, in step 1183, and the DCF counter value in step 1185.

Accordingly, in consideration of the foregoing steps 1171 to 1185 as shown in FIG. 11B, the CPU 911 checks whether or not the supply power supplied to the linear power amplifier LPAn exceeds the set range, and upon the supply power supplied thereto exceeding the set range therefrom, checks that the above supply power was in the failed state and accumulatively stores the time supplied with the unstable supply power, thereby clearing the value of the DCF counter if the supply power of the linear power amplifier LPAn is supplied in the normal range.

At a fifth time, the CPU 911 outputs the second selection signal SEL2 for selection of the output LOP of the loop fail condition detector 815, in step 1191, and the alarm selector 818 selects the output LOP of the loop fail condition detector 815 in response to the second selection signal SEL2 and outputs the selected output to the CPU 911. At this case, the loop fail condition detector 815 inputs the output of the signal canceler 219 divided in the power divider 233, detects the size of the RF signal which is not canceled as it is included in the output of the signal canceler 219 and sets the LOP signal to display the loop fail state when exceeding the RF signal from the set range.

After that, as the LOP signal has been set in analyzing the state of the LOP signal, the CPU 911 checks, in step 1193, whether or not the RF signal is canceled in the signal canceler 219. Thus, when checked therein that the RF signal was canceled therein, the CPU 911 proceeds to step 1195, thereby checking whether or not the LOP flag is already set. Then, upon the LOP flag was not already set, the CPU 911 recognizes that the LOP fail state was first generated and proceeds to next steps 1197 and 1199, thereby setting the LOP flag in the step 1197 and activating the LOP counter for accumulating the time value when the loop gain state exists, in the step 1199. However, when checked in the above step 1195 that the LOP flag was set, the CPU 911 recognizes that the previous state was the loop fail state, to thereby increase the LOP counter value and to accumulate the time value when the loop fail state is maintained.

Meanwhile, when checked in the foregoing step 1193 that the RF signal was not canceled in the signal canceler 219, the CPU 911 senses that the loop is performed normally, thereby clearing the LOP flag in step 1203 and the LOP counter in step 1205.

Figure 11C:
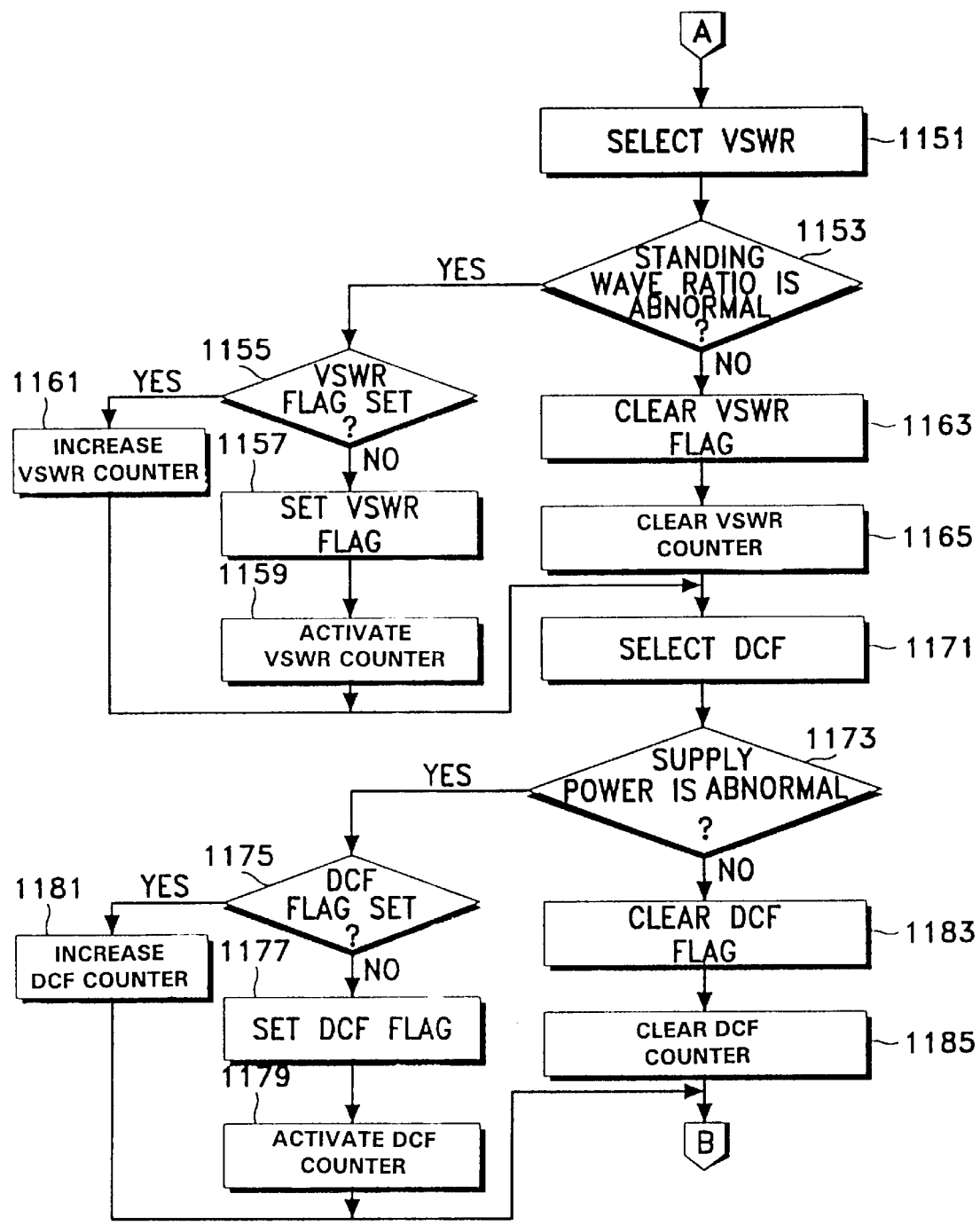

Moreover, concerning the operations of the above steps 1191 to 1205 as shown in FIG. 11C, the CPU 911 detects the output of the signal canceler 219, checks whether or not the RF signal is normally canceled, judges the loop fail in the case that the cancellation of the RF signal deviated from the set range, accumulatively stores the time when the loop fail is lasted, recognizes that the loop is in the normal state when the RF signal is normally canceled, and clears the LOP counter.

At a sixth time, the CPU 911 outputs the second selection signal SEL2 for selection of the output LWP of the low power condition detector 816, in step 1211, and the alarm selector 181 selects the output LWP of the low power condition detector 816 by the second selection signal SEL2 and outputs the detected output LWP to the CPU 911. At this case, the low power condition detector 816 detects the difference of the voltage between the input RF signal and the output RF signal, two input and output RF signals being divided in the power dividers 231 and 234, and sets the LWP signal to display the fact that the gain of the linear power amplifier LPAn is in the failed state if the difference of the voltage therebetween is not of a value belonging to the set range.

After that, as the LWP signal is set in analyzing the state of the LWP signal, the CPU 911 checks, in step 1213, whether or not the total output gain of the linear power amplifier LPAn is abnormal, and in the event that the total output gain thereof was abnormal, the CPU 911 checks in step 1215 whether or not the LWP flag is set. At this point, when checked herein that the LWP flag was not set, the CPU 911 senses that the gain failed state of the linear power amplifier LPAn was firstly generated, thereby proceeding to next steps 1217 and 1219 then to set the LWP flag and to activate the LWP counter for accumulating the time value when the gain failed state of the linear power amplifier LPA is generated. But, upon the LWP flag is set in the step 1215, the CPU 911 senses that the previous state was already the failed state, so that the LWP counter can be increased to accumulate the time value when the failed state exists, in step 1221.

On the other hand, in the event in the above step 1213 that the total output gain thereof was not abnormal, the CPU 911 considers that the gain of the linear power amplifier LPAn maintains its normal state, thereby clearing the LWP flag in step 1223 and the LWP counter in step 1225.

With respect to the operations of the aforesaid steps 1211 to 1225, the CPU 911 analyzes the difference of the voltage between the input RF signal and the output RF signal of the linear power amplifier LPA, senses the failed state of the overall gain of the linear power amplifier LPAn in the occasion when the difference of the voltage therebetween exceeds the set range, accumulatively stores the time when the gain fail exists, and judges that the overall gain of the linear power amplifier LPAn is in the normal state in the case that the difference of the voltage between the above RF signals, has not exceeded the set range, thereby clearing the LWP counter.

At a seventh time, the CPU 911 outputs the second selection signal SEL2 for selection of the output FAN of the fan fail condition detector 817, in step 1231, and the alarm selector 818 selects the output FAN of the fan fail condition detector 817 by the second selection signal SEL2 and outputs the selected output to the CPU 911. Here, the fan fail condition detector 817 inputs a fan driving signal located at the linear power amplifier LPAn, checks the state of the fan driving signal, and sets the FAN signal upon a determination that the fan driving is not being normally performed.

Following that, as the FAN signal is set in analyzing the state of the FAN signal, the CPU 911 checks, in step 1233, whether or not fan driving is abnormal. Then, upon the fan driving being abnormal, the CPU 911 proceeds to step 1235 to thereby check whether or not the FAN flag is set. At this point, when checked herein that the FAN flag was not set, the CPU 911 senses that the abnormal state of the fan driving gain was first generated, thereby proceeding to next steps 1237 and 1239 then to set the FAN flag and to activate the FAN counter for accumulating the time value when the fan is abnormally driven. But, upon the FAN flag being set, in the step 1235, the CPU 911 senses that the fan driving in the previous state was already in the abnormal state, so that the FAN counter can be increased to accumulate the time value when the abnormal state of the FAN driving exists, in step 1241.

However, in the event in the above step 1233 that the fan driving was not abnormal, the CPU 911 considers that the fan was normally driven, thereby clearing the FAN flag, in step 1243, and the FAN counter, in step 1245.

In regard to the operations of the aforesaid steps 1231 to 1245 as shown in FIG. 11C, the CPU 911 analyzes the driving signal of the fan for cooling the heat of the linear power amplifier LPAn, accumulatively stores the time when the fan is driven in the abnormal state upon the FAN driving in the abnormal state, and clears the FAN counter in the occasion when the fan is normally driven.

Each of the linear power amplifiers LPAn employed in the combined linear power amplifying device 10 operated as above, detects the existence/nonexistence of generation of the over power, the high temperature, the standing wave ratio fail state, the supply power fail state, the loop fail state, the overall gain fail state, the fan driving fail state, etc., in the interior of the corresponding unit at every first set time, in a sequential manner. In such a manner, while setting the corresponding fail flag to display the state corresponding to the item that the failed state is generated for, the CPU 911 accumulatively stores at the corresponding alarm counter, the time when the failed state exists, and clears the flag and the counter of the corresponding state in the normal condition.

As stated hereinabove, the linear power amplifiers LPAn detect and process the existence/nonexistence of the generation of their failed states, check each of the flags and the counters, and perform functions for turning on/off the corresponding RF switches of the power divider module 100 and the power combiner module 300.

Upon observation of the above steps, the CPU 911 reads the flags representative of the existence/nonexistence of the failed state, in step 1251, to analyze the results obtained while performing the foregoing steps 1111 to 1245. In this instance, first, following the reading of the OVP flag, the CPU 911 checks, in step 1253, whether or not the OVP flag is set. Here, when checked therein that the OVP flag was not set, the CPU 911 checks, in step 1255, whether or not the current read flag is a final flag. At this moment, when checked therein that the current read flag was not the fmal flag, the CPU 911 proceeds to step 1257 to read the next flag, thereby returning to the above step 1253 to perform the corresponding operation. Therefore, the CPU 911 checks the state of the flag while sequentially reading the OVP flag from the first to the final in the method as described previously.

Herein, as the set flag representative of the failed state in the operations as explained above is checked, the CPU 911 recognizes, in step 1253, that the OVP flag was set and proceeds to sequential step 1259, thereby reading the counter value corresponding to the corresponding flag. In this case, the counter is in the state where the time value having the corresponding existed failed state is accumulatively stored, as mentioned hereinbefore. After reading the counter value, the CPU 911 checks, in step 1261, whether or not the counter value corresponding to the flag indicating the failed state is equal to or more than the second set time value. Herein, the second set time value is to terminate the operation of the linear power amplifier LPAn, which is set to about 7 seconds in a preferred embodiment of the present invention. Then, when the time accumulated and stored in the counter of the failed state is maintained less than 7 seconds, the CPU 911 proceeds to the above step 1255 to thereby check whether or not the current read flag is the final flag.

But, when checked in the aforesaid step 1261 that the counter value corresponding to the flag indicative of the failed state was equal to or more than the second set time value, the CPU 911 proceeds to step 1263, so that the switching control signal SWC including a switch-off signal can be generated to remove the RF signal input to the corresponding linear power amplifier LPA and to output the generated alarm information to the communicator 916. Herein, the alarm information output from the communicator 916 is applied to an external operator to be processed. Then, upon generation of the switching control signal SWC being turned to off, the corresponding RF switch SWIn of the power divider module 100 is turned off and the corresponding RF switch SWOn of the power combiner module 300 is turned off. Therefore, the linear power amplifier LPAn, where the failed state occurs, automatically terminates its amplifying operation because the transmission path of the RF signal is now opened. At this moment, as shown in FIG. 2, since the output terminal coupled to the abnormally-operating linear power amplifier LPAn is turned off, the power divider module 100 evenly divides and applies the power of the RF signal input to the node NI to the rest of the linear power amplifiers LPAn not experiencing a failed or abnormal state. Also, since the input terminal coupled to the abnormally-operating linear power amplifier LPAn is also turned off, the power combiner module 300 isolates the output signal of the abnormally-operating linear power amplifier, and combines and outputs only the signals input from the linear power amplifiers LPAn operating normally. As a result, as discussed above, if the failed state is generated in an arbitrary linear power amplifier LPAn employed in the combined linear power amplifying device 10, the corresponding linear power amplifier LPAn automatically isolates the RF path connected thereto, and after evenly dividing the power of the RF signal to the normally-operating linear power amplifiers, the combined linear power amplifying device performs the linear amplifying operation, and combines and outputs the amplified signal.

Here, now that the RF amplifying signal occurs without the loss of the power of the signal in the steps of dividing and combining the signal, it can be seen from the above that the combined linear power amplifying device can amplify and output the RF signal of a set size.

Following the activation of the switching control signal SWC, as described above, the CPU 911 sets the switch-off flag indicating that the switching control signal SWC is turned to off to block the current RF signal, in step 1265, and activates a switch-off timer, in step 1267, wherein the switch-off flag is to display that the path of the RF signal is blocked and the amplifying operation is terminated in the path where the current linear power amplifier LPAn is in the failed state. The switch-off timer is to accumulatively store the time value when the amplifying operation is terminated in the failed amplifier. And then, in the case that the RF switch is re-closed (SWC turned to on) the CPU 911 respectively clears all flags and timers in steps 1269 and 1271, the above flags indicative of the failed state of OVP, TEMP, VSWR, DCF, LOP, LWP, and FAN and the above timers accumulatively storing the time when the failed state existed.

Figure 11D:
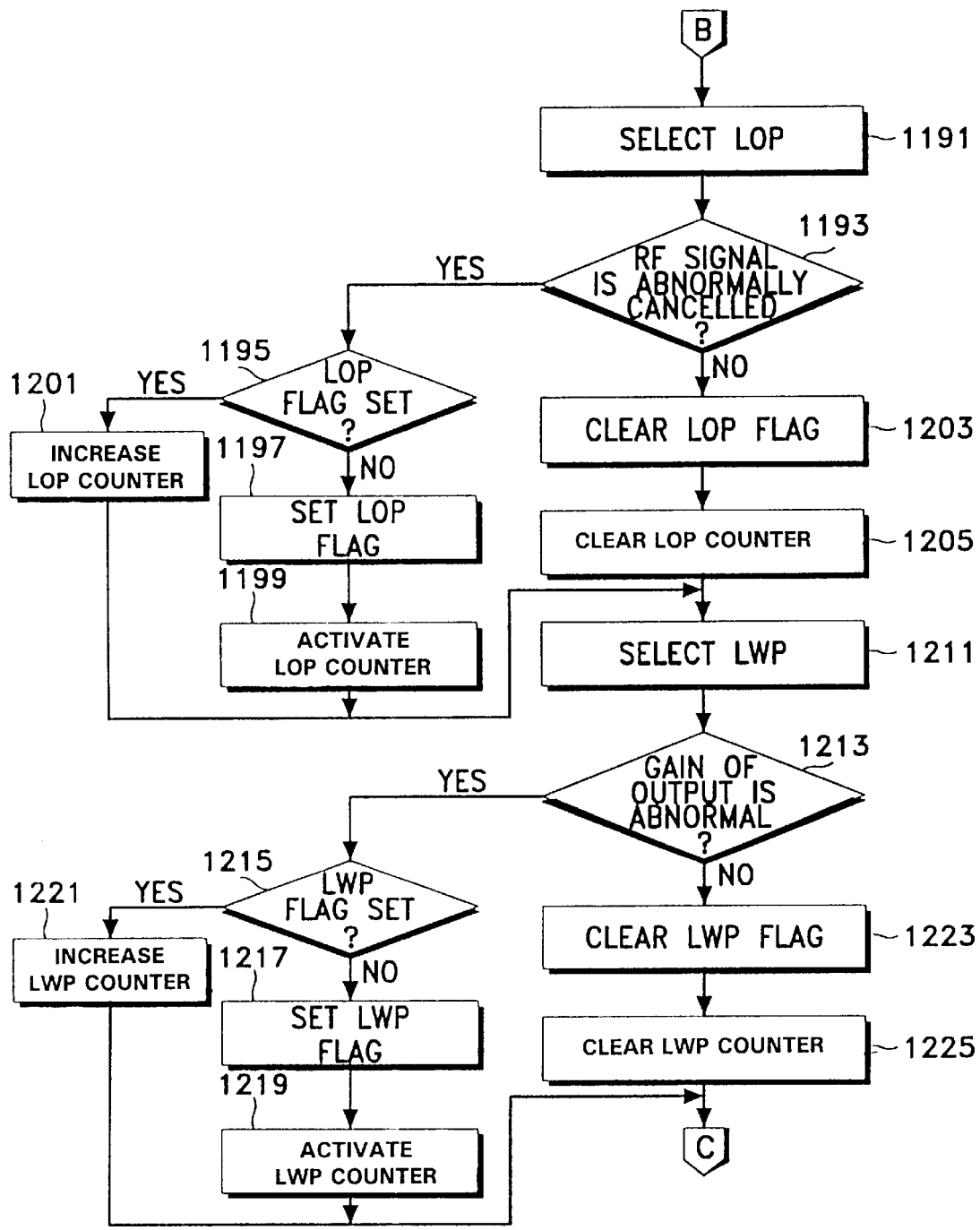

In the event that the special failed state lasts for the second set time after checking each of the states at the first set period of time, in the above steps 1251 to 1271 as shown in FIG. 11D, the CPU 911 turns off the RF switches, terminates the operation of the corresponding linear power amplifier, sets the switch-off flag to display the generation of the failed state, and lastly drives the switch-off timer to accumulate the time that the RF signal is blocked in the corresponding path. In that case, the linear power amplifier LPAn in which the failed state is generated, again re-drives in the case that the set time is passed, for the sake of checking whether or not the previous failed state is temporarily generated. Accordingly, the switch-off timer determines the point to re-drive (close) the RF switches after opening the RF switches. Further, after opening the RF signal, as explained above, each of flags and timers is cleared for the reason of normally detecting the existence/nonexistence of the failed state upon re-driving the RF switches.

Figure 11E:
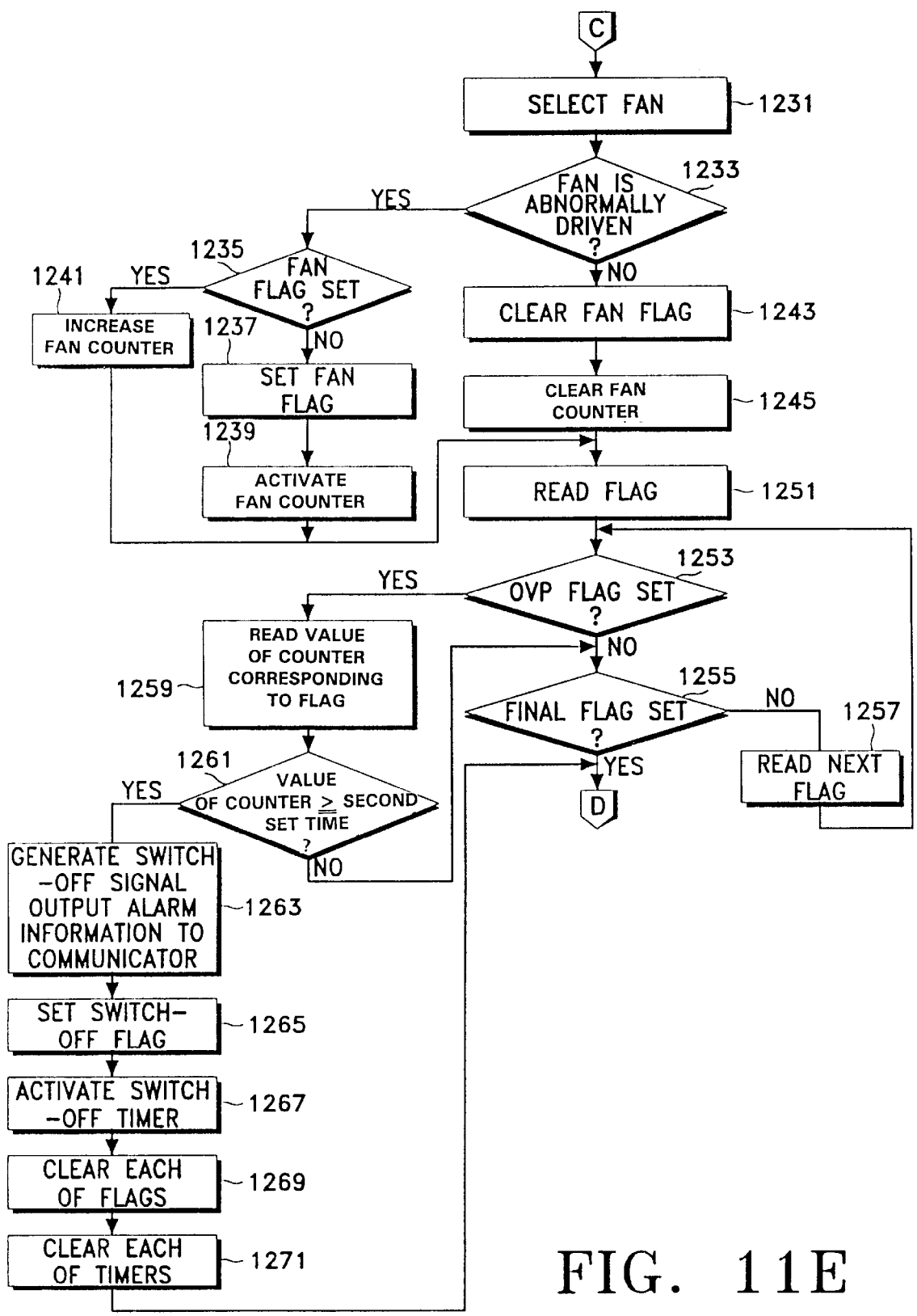

On the other hand, when checked in the previously-mentioned step 1103 of FIG. 11A that the switch-off flag was set, the RF switches of the corresponding linear power amplifier LPAn in the power divider module 100 and the power combiner module 300 is turned off. In this case, the CPU 911 checks whether or not the off times of the switches SWI and SWO pass the third set time. That is to check whether the failed state of the linear power amplifier LPAn is temporarily (non-fatally) generated or permanently (fatally) generated by again restarting the driving of the linear power amplifier LPAn upon a given time having passed after terminating the driving of the linear power amplifier LPAn. As a result, as illustrated in FIG. 11E, the CPU 911 reads the switch-off timer value, in step 1285, and checks, in step 1287, whether or not the value of the switch-off timer is equal to or more than the third set time. Then, in the event that the value of the switch-off timer is not equal to or more than the third set time, the CPU 911 proceeds to step 1289, thereby resetting the value of the switch-off timer and again returning to the above step 1101 of FIG. 11A.

As described above, once the switch-off flag is set, the CPU 911 turns off the switches SWI to SWO until the value of the switch-off timer reaches to the value of the third set time. At this point, when checked, in the step 1287, that the value of the switch-off timer was equal to or more than the third set time, the CPU 911 reads the value of the switch-off counter, in step 1291. Here, the switch-off counter is for accumulatively storing the number that the switch is turned off and, if the switch number is more than the set number, the corresponding linear power amplifier LPAn is in the fatally failed state. For this reason, the linear power amplifier LPAn operates to terminate its further driving. Thus, the CPU 911 checks, in step 1293, whether or not the value of the switch-off counter exceeds or is equal to the set number N. And, when checked, as above, that the value of the switch-off counter exceeded or was equal to the set number N, the CPU 911 proceeds to step 1305, thereby setting the driving of the linear power amplifier LPAn to be terminated and controlling the communicator 916 to inform the generation of the failed state of the linear power amplifier to the external operator.

But, when checked in the above step 1293 that the value of the switch-off counter did not exceed or was not equal to the set number N, the CPU 911 turns on the switching control signal SWC, in step 1295, and generates release information of the corresponding alarm through the communicator 916. Therefore, the external operator can discriminate the failed state of the system, by automatically outputting the failed state and release state information of the combined linear power amplifier through the communicator 916. Further, when the switching control signal SWC is turned on, the CPU 911 restarts the operation of the linear power amplifier LPAn after passing the third set time in the state where the operation is terminated by sensing the failed state of the linear power amplifier LPAn. In this occasion, the RF switches SWO and SWI of the power divider module 100 and the power combiner module 300 are turned on by the switching control signal SWC, whereby the path capable of inputting and outputting the RF signal is formed in the corresponding linear power amplifier LPAn. Hereinafter, the CPU 911 clears the switch-off flag, in step 1297, and clears the switch-off timer, in step 1299, thereby increasing the value of the switch-off counter and preparing the next state. Furthermore, the CPU 911 resets the value of the switch-off counter, in step 1301, sets the switch-on flag, in step 1303, and activates the switch-on timer, in step 1307, thereby returning to the above step 1231 of FIG. 11D.

Figure 11F:
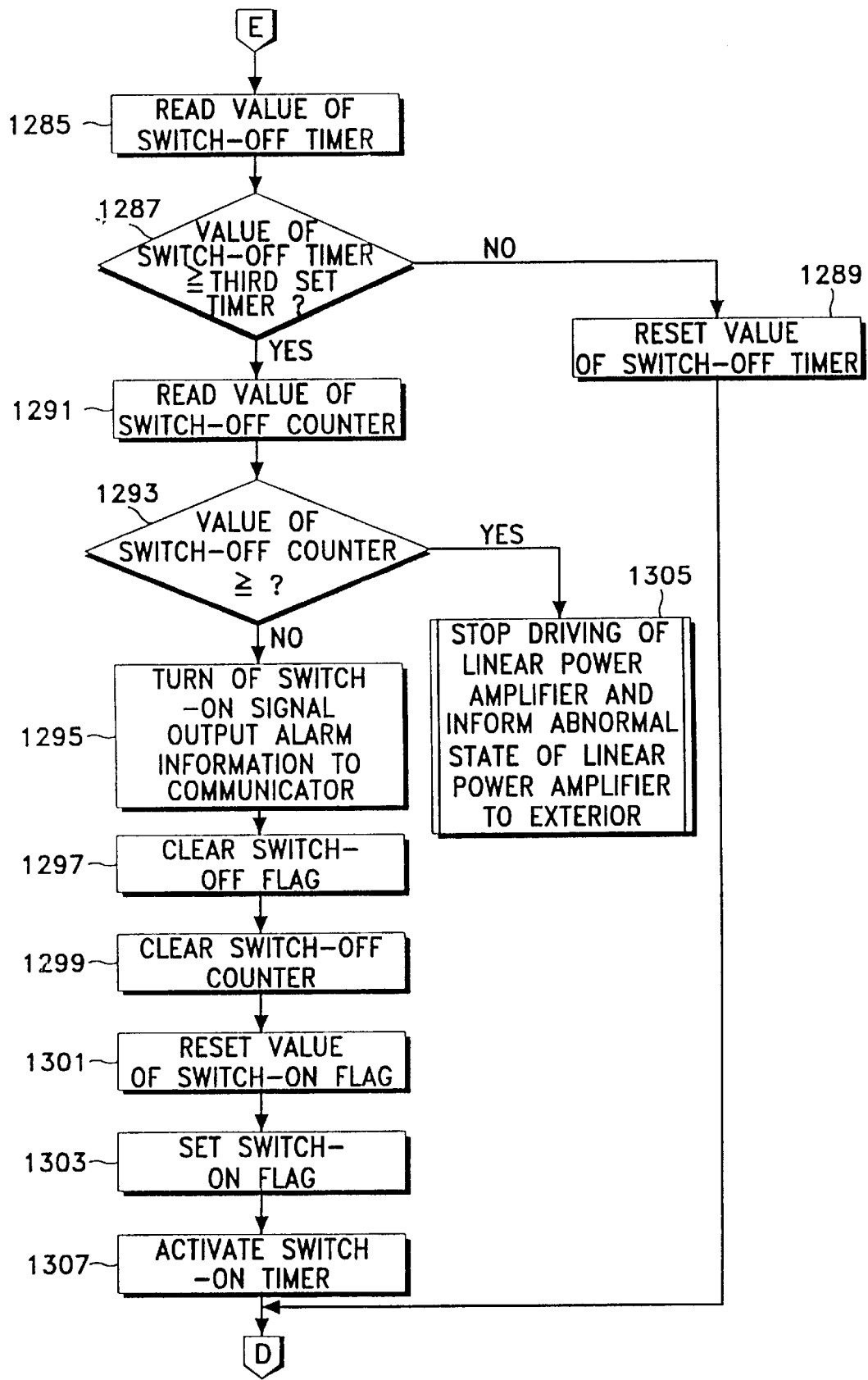
Figure 11G:
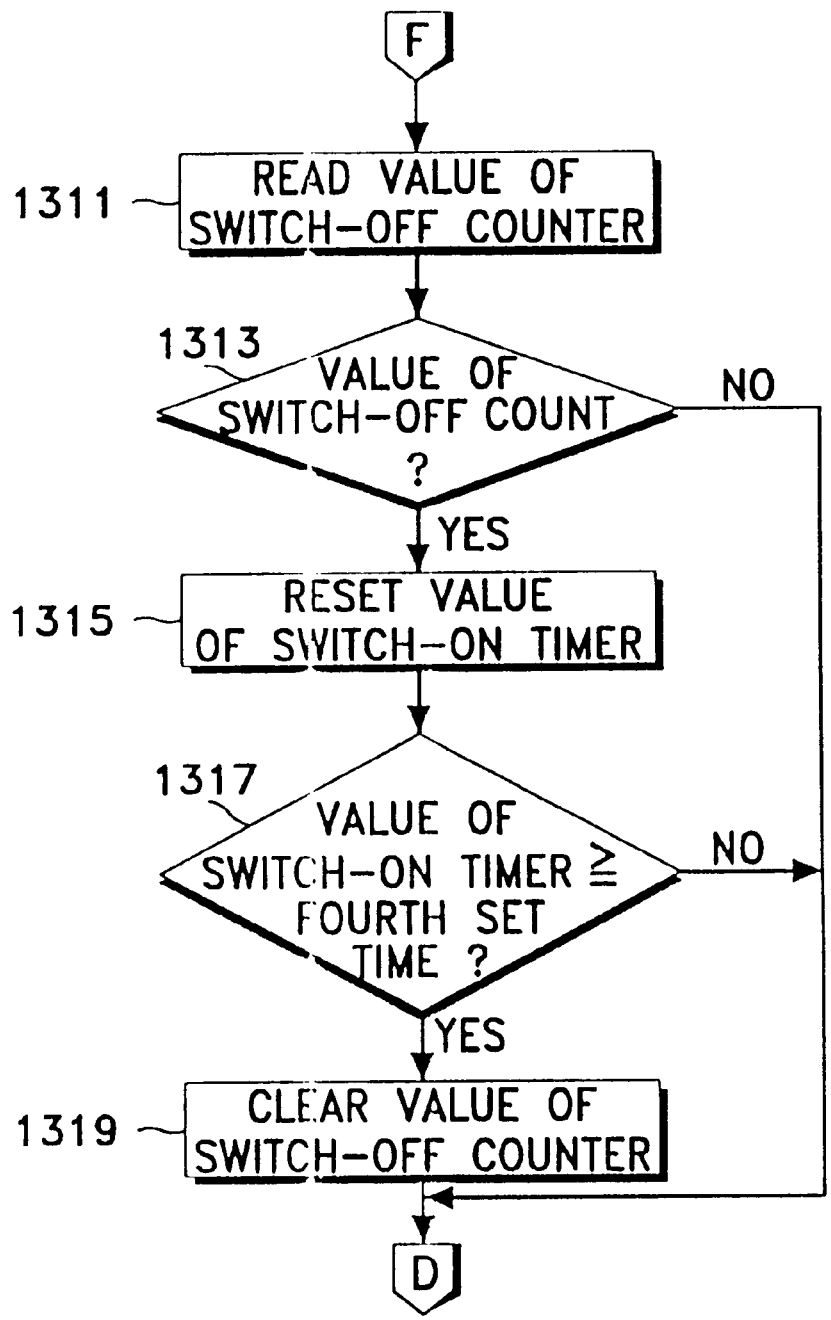

Likewise, when checked in the above 1101 of FIG. 11A that the first set time was not inputted, the CPU 911 reads the value of the switch-off counter, in step 1311, and checks, in step 1313, whether or not the value of the switch-off counter exists, as depicted in FIG. 11F. At this time, when checked therein that the value of the switch-off counter was not "0", it is meant that the operation of the linear power amplifier LPAn in the previous state is terminated. In this event, if the switch-on timer lasted during the given time, the value of the switch-off counter can be cleared. That is, even if the normal operation is again restored in the state where the switch-off number is accumulated and stored in the switch-off counter, the switch-off counter maintains the state where the corresponding number is continuously stored in the switch-off counter. Accordingly, upon the linear power amplifier LPAn maintaining the abnormal/normal state during a fourth set time in the embodiment of the present invention, since it is judged that the corresponding linear power amplifier is normally operated, the CPU 911 clears the value of the switch-off counter. In this instance, the fourth set time is set to be more than the third set time. Therefore, when checked in the above step 1313 that the value of the switch-off counter was not "0", the CPU 911 proceeds to step 1315, thereby resetting the value of the switch-on timer and checks, in step 1317, whether or not the value of the switch-on timer is more than or equal to the fourth set time.

Then, when checked that the value of the switch-on timer was more than the fourth set time, the CPU 911 clears the value of the switch-off counter, in step 1319 and returns to the above step 1101 of FIG. 11A.

Operations of the alarm detector 238 constructed as above will be seen from the following Table 1.

TABLE 1

| Kind of Alarms | Generation Condition | Checking and Preventing method |
|---|---|---|
| OVP over power alarm | generated upon power of linear power amplifier is over power | check level of inputted signal and initialize level of inputted signal after lowering level thereof below regular value |
| TEMP high temperature alarm | generated upon internal temperature of linear power amplifier is over 82° C. ± 5° C. | check whether fan is normally operated |
| VSWR VSWR alarm | generated upon VSWR is over 3:1 (−6 dB ± 2 dB) | checks whether outputted terminal is open |
| DCF DC fail alarm | generated upon supply power is abnormal in DC/DC PSU | check DC power outputted in PSU of linear power amplifier |
| LOP loop fail alarm | generated upon RF signal is not normally canceled in output of signal canceler | measure gain of signal canceler |
| LWP loop power alarm | generated upon gain is over +2 dB + 0/−1 dB for abnormal state of interior of linear power amplifier | measure overall gain of linear power amplifier |
| FAN fan fail alarm | generated upon fan is not normally driven | replace old fan with new fan |

The combined linear power amplifying device according to the present invention, as described hereinabove, checks outputs of detectors as illustrated in the above Table 1 at the first set period of time, sets the flag of the corresponding detector upon generation of the signal indicative of the failed state in any particular detector and activates the timer for storing the lasting time of the failed state. With repeating above steps, the combined linear power amplifying device checks outputs of each of the detectors and sequentially checks the state of the flags. At this point, when no flag is set in the above checking step, the linear power amplifier LPAn performs its normal operation, thereby performing stand-by operation to the first set time after returning. Also, in the standby state of the detecting operation, the linear power amplifier LPAn forms therein the path for inputting and outputting the RF signal to the power divider module 100 and the power combiner module 300. Consequently, the power divider module 100 power-divides the input RF signal in correspondence with the number of the linear power amplifiers LPAn and outputs the power-divided signal, and each of the linear power amplifiers LPAn linearly amplifies the power-divided and input RF signal and outputs the linearly amplified signal. Then, the power combiner module 300 combines and outputs the RF signals outputted and amplified in each of the linear power amplifiers LPAn.

However, when checked that any one of the flags among the flags of the detectors in a checking step was set, the CPU 911 sequentially reads the value of the timer of the corresponding detectors and checks whether or not the second set time is passed. At this case, when checked that the second set time was not passed, the CPU 911 resets the value of the timer and stands by until reaching the first set time. Also, when checked that the value of the timer of the detector exceeded the first set time, it is detected that the linear power amplifier LPAn is seriously abnormal. Thus, in that time, the corresponding linear power amplifier LPAn turns off the switches SWIn and SWOn of the power divider module 100 and the power combiner module 300 connected thereto. Then, the power divider module 100 divides the power of the RF signal to be inputted to the corresponding linear power amplifier LPAn in the case that the input terminal of the RF signal connected to the corresponding linear power amplifier is turned off, and inputs the divided power thereof to the normally-driven linear power amplifiers LPAn. Moreover, when the input terminal connected with the linear power amplifier LPAn where the abnormal state is generated is turned off, the power combiner module 300 power-combines the RF signal outputted and amplified in the normal linear power amplifiers LPAn and outputs the power-combined signal. Here, the linear power amplifier LPAn of the abnormal state in the linear power amplifier module 200 terminates its linear amplifying function because the path of the RF signal is opened, and the normal linear power amplifiers LPAn input the RF signal of the higher level by the power divider module 100, thereby finally linearly amplifying the inputted signal as the RF signal having a larger gain and outputting the linear amplified signal. As a result, the power of the fmal RF signal combined and outputted in the power combiner module 300 has the same value as that of the RF signal in the normal state.

Upon the operation of the linear power amplifier being terminated by the generation of the failed state, the corresponding linear power amplifier terminates the operation during the third set time, turns off the switches SWI and SWO of the power divider module 100 and the power combiner module 300, and again performs the detection operation, as described above, that is, to check whether the failed state of the linear power amplifier is generated temporarily or fatally (permanently). In conclusion, the linear power amplifier LPAn once more performs the detection operation and detects the existence/nonexistence of the generation of the failed state. Thus, when the failed state is maintained over the second set time, the input/output path of the RF signal of the linear power amplifier LPAn is again opened and is standby until the third set time is passed. The above operations is repeatedly performed by N times and, when the failed state is lasted until N'th repeat performances, the linear power amplifier LPAn terminates further detection operation and informs the detected result to the exterior.

On the other hand, when checked that each of the detectors was normal in the detection step, the linear power amplifier LPAn detects the value of the counter and checks whether the operation of the linear power amplifier LPAn is terminated in the previous state. Here, when the operation was terminated, the linear power amplifier LPAn detects the time when the linear power amplifier is normally driven and, upon the fourth set time is passed, clears the value of the counter, thereby again returning the amplifier path to the normal driving state.

Herein, the first set time uses a timer interrupt signal repeatedly generated at a regular period and the set times can be set in the condition where fourth set time>third set time>second set time>first set time. As well, it is assumed that the second set time can be set to about 7 seconds and the third set time can be set to about 1 minute in a preferred embodiment of the present invention.

Figure 12A:
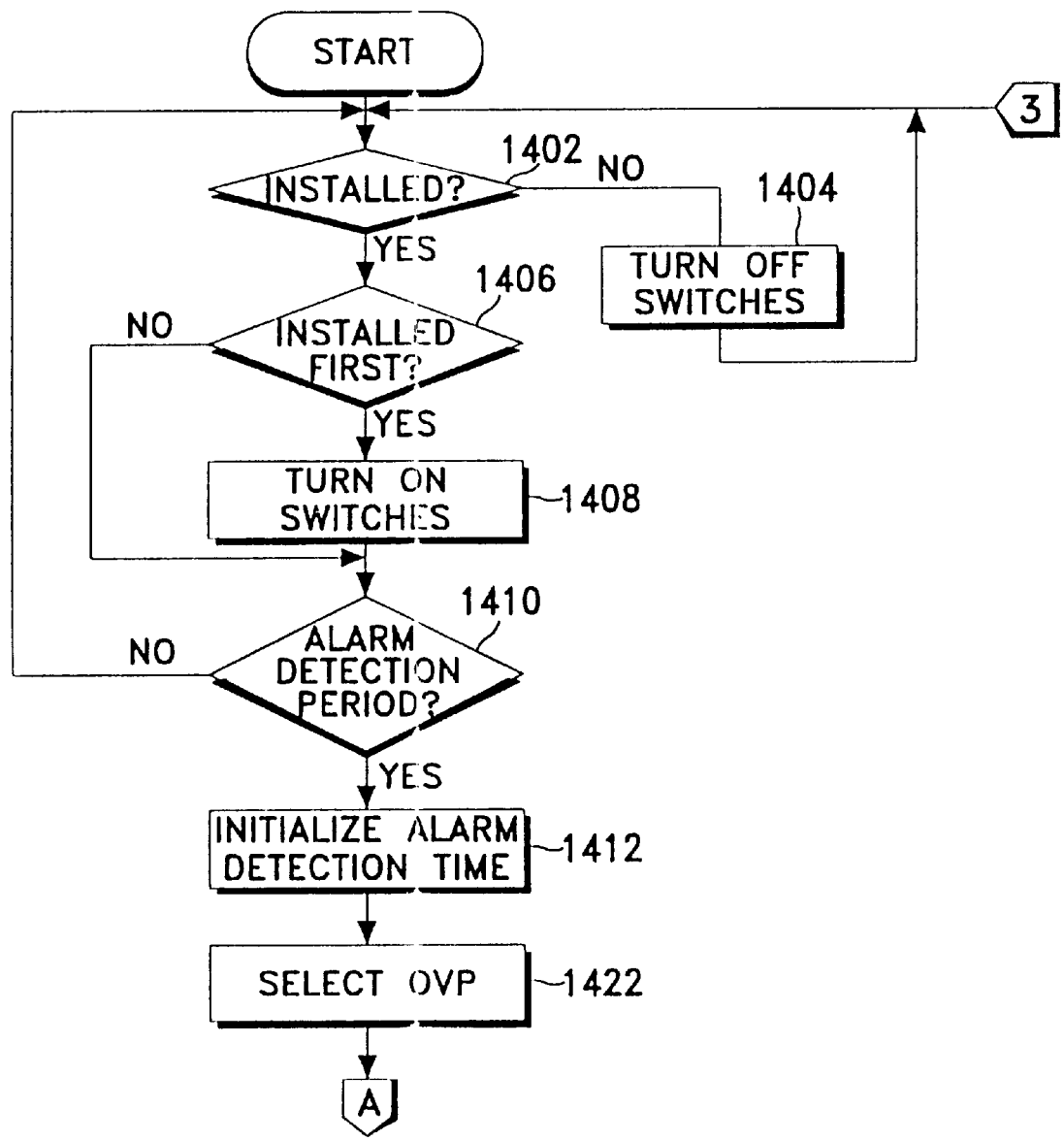
FIGS. 12A through 12D are flow charts showing operation processes of another embodiment of a combined linear power amplifying device according to the present invention.
Figure 12B:
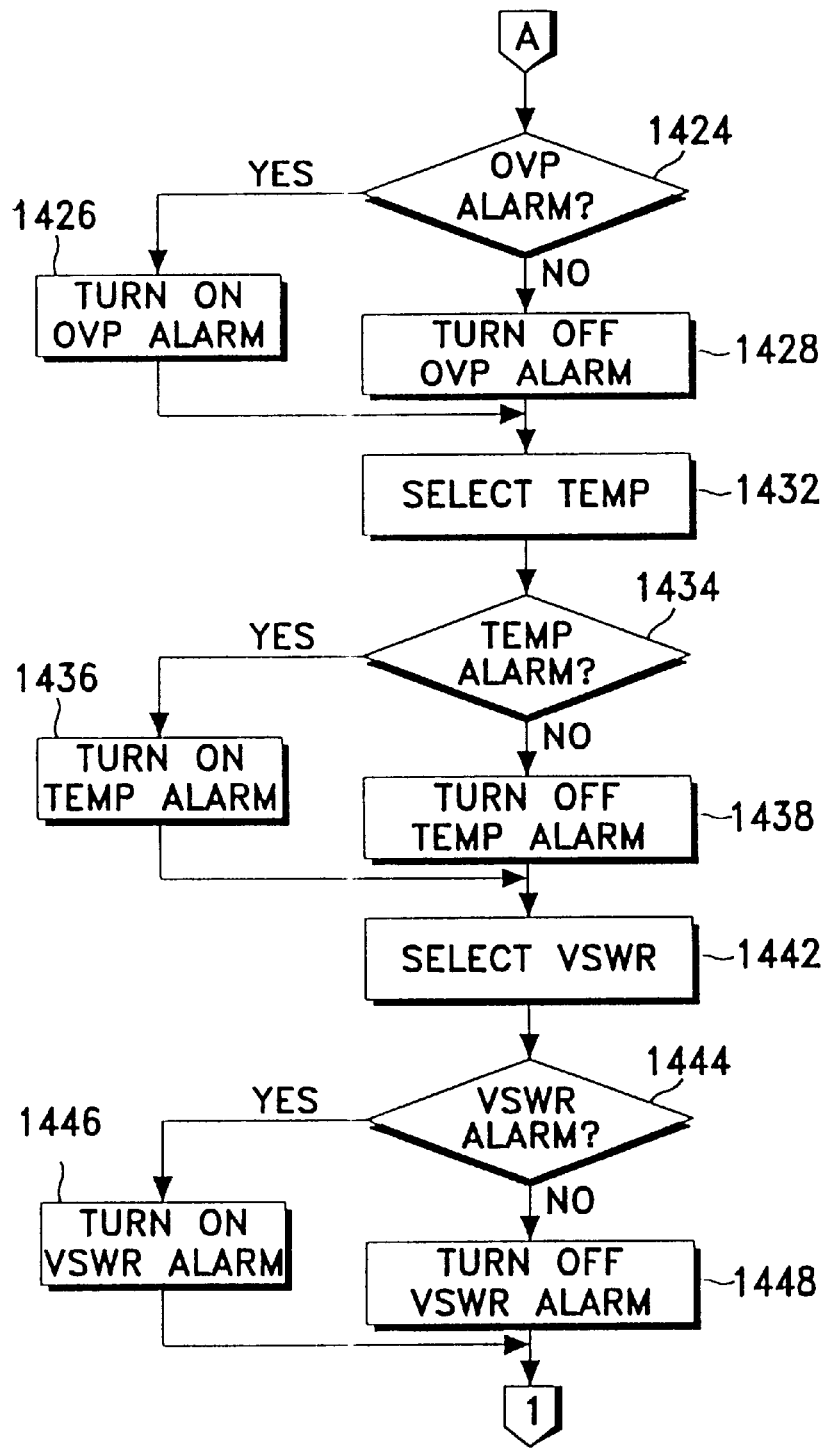
Figure 12C:
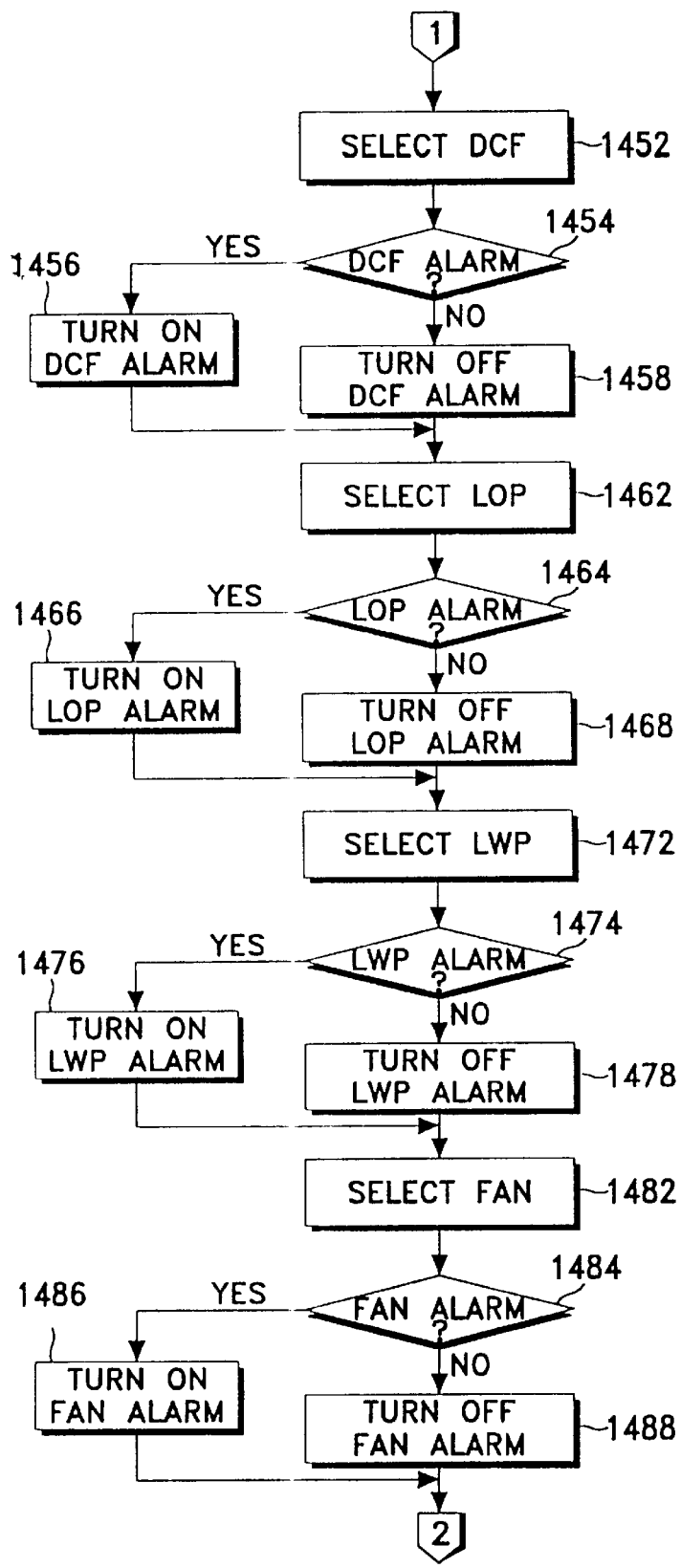
Figure 12D:
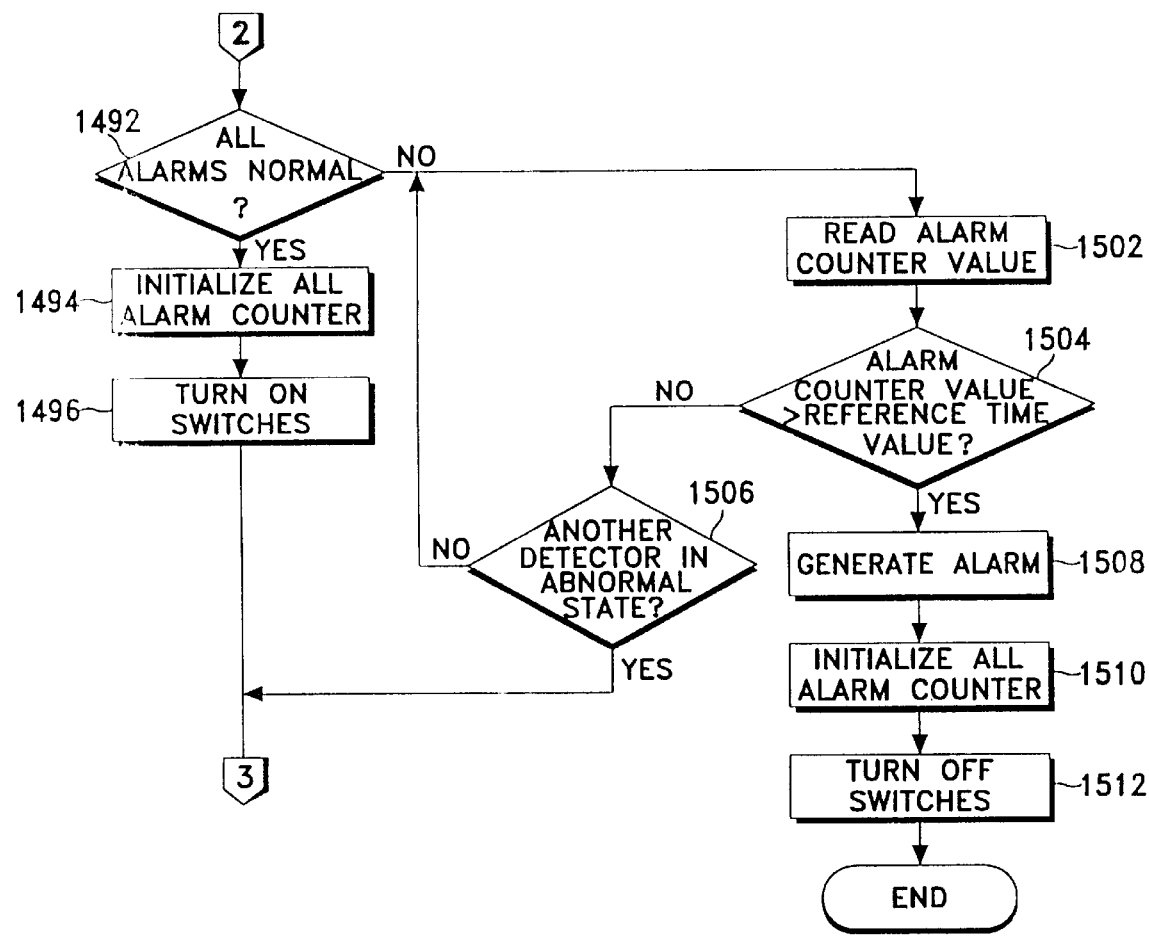

FIGS. 12A through 12D are flow charts showing operation processes of another embodiment of a combined linear power amplifying device according to the present invention. With reference to FIGS. 12A through 12C, the CPU 911 checks, in step 1402, whether the corresponding linear power amplifier LPAn is installed in the power divider module 100 and the power combiner module 300, by examining the output of the installation sensor 917. If the installation sensor 917 generates the non-installation signal, the CPU 911 turns off the switches SWI and SWO connected respectively to the power divider module 100 and the power combiner module 300, in step 1402 and then, returns to the step 1402. However, if the installation signal is generated in the step 1402, the CPU 911 checks, in step 1406, whether the linear power amplifier LPAn is installed first or not. If so, the CPU 911 turns on the RF switches SWI connected to the power divider module 100 and the RF switches SWO connected to the power combiner module 300, in step 1408 and then, proceeds to step 1410 to check the operation state of the linear power amplifier LPAn. However, if the linear power amplifier LPAn is not installed first in the step 1406, the CPU 911 directly proceeds to step 1410 to check the operational state of the linear power amplifier LPAn.

The process for checking the operation state of the linear power amplifier is performed at a specified period. Therefore, the CPU 911 checks, in step 1410, whether it is a time for an alarm detection period. If so, the CPU 911 initializes an alarm detection time, in step 1412 and sequentially selects the outputs of the alarm detector 238 to check the failed state. Here, if the alarm detection period is, for example, 200 msec, the CPU 911 repeats the process of FIGS. 12A to 12C at the period of 200 msec.

The linear power amplifier LPAn of the combined linear power amplifying device sequentially receives the outputs of the alarm detector 238 having the construction shown in FIG. 9, and detects the existence/nonexistence of the failed state. In steps 1422 through 1428, the CPU 911 selects an output of the over power condition detector 811 to detect the over power condition of the corresponding linear power amplifier LPAn. In steps 1432 through 1438, the CPU 911 selects the output of the high temperature detector 812 to detect the high temperature condition of the corresponding linear power amplifier LPAn. In steps 1442 through 1448, the CPU 911 selects the output of the standing wave ratio detector 813 to detect the standing wave ratio in failed state of the corresponding linear power amplifier LPAn. In steps 1452 through 1458, the CPU 911 selects the output of the supply power fail detector 814 to detect the power fail state of the corresponding linear power amplifier LPAn. In steps 1462 through 1468, the CPU 911 selects the output of the loop fail condition detector 815 to detect the loop fail state of the corresponding linear power amplifier LPAn. In steps 1472 through 1478, the CPU 911 selects the output of the low power condition detector 816 to detect the low transmission power state of the corresponding linear power amplifier LPAn. In steps 1482 through 1488, the CPU 911 selects the output of the fan fail condition detector 817 to detect fan failed state of the corresponding linear power amplifier LPAn.

If an abnormal signal is detected in the process of checking the outputs of the respective detectors 811–817, the CPU 911 turns on the alarm corresponding to the detector from which the abnormal signal is generated, and activates the corresponding alarm counter. If the alarm state is continuously maintained in the state where the alarm counter has been already activated, the CPU 911 maintains driving of the corresponding alarm counter to accumulate the alarm generation time. This is done in the corresponding alarm processing steps 1426, 1436, 1446, 1456, 1466, 1476 and 1486 of FIGS. 12A and 12B, similarly to the respective alarm processing steps of FIGS. 11B through 11G.

If the output of the corresponding detector is restored to the normal state in the process of detecting the outputs of the detectors 811-817, the CPU 911 initializes the corresponding alarm counter value. This is done in the corresponding alarm processing steps 1428, 1438, 1448, 1458, 1468, 1478 and 148, similarly to the respective alarm release processing steps of FIGS. 11B through 11G.

As mentioned above, upon receiving an abnormal signal from the detectors, the CPU 911 activates the corresponding alarm counter to count and accumulate the sustaining time of the abnormal state. In the interim, if the corresponding detector is restored to the normal state, the CPU 911 initializes the corresponding alarm counter to clear the time accumulated up to the present.

After detecting the states of all the detectors 811-817, the CPU 911 checks, in step 1492, whether the outputs of all the detectors 811-817 are normal or not. If so, the CPU 911 initializes all the alarm counters, in step 1492 and then, turns on the switches SWI and SWO for respectively connecting the linear power amplifier LPAn to the power divider module 100 and the power combiner module 300. Thereafter, the CPU 911 returns to the step 1402.

However, if an output from any one of the detectors 811–817 is abnormal in the step 1492, the CPU 911 reads the alarm counter value in the abnormal state, in step 1502 and then, compares the read alarm counter value with a reference time value, in step 1504. Herein, the reference time is a time for turning off the switches SWI and SWO when the alarm generation duration exceeds a specified time. Preferably, the reference time should be set to 7 seconds as in the first embodiment of the present invention. If the alarm counter value is less than the reference time value in the step 1504, the CPU 911 proceeds to step 1506 to see if there is another detector in the abnormal state. If there is another detector in the abnormal state, the CPU 911 returns to the step 1502 to repeatedly compare the alarm counter value with the reference time value, and if there is no detector in the abnormal state, the CPU 911 returns to the step 1402 to wait for the next detection period.

However, if the alarm counter value is larger than the reference time value in the step 1504, it is meant the corresponding linear power amplifier LPAn has a fatal error, with the error state exceeding the set time. In this case, the CPU 911 immediately transmits to the operator the alarm for the abnormal state by controlling the communicator 916, in step 1508. Then, the CPU 911 initializes all the alarm counter values, in step 1510 and turns off the switches SWI and SWO connected to the power divider module 100 and the power combiner module 300, to disconnect the input/output of the corresponding linear power amplifier LPAn, thereby to complete the routine.

In this case, the linear power amplifier LPAn is separated from the combined linear amplifying device, so that the power divider module 100 may equally distribute the output thereof to the linear power amplifiers LPAn which operate normally. The linear power amplifiers in normal operation amplify the distributed signals having the higher level, and the power combiner module 300 combines the signals generated from the linear power amplifiers LPAn in the normal operation. Accordingly, though a certain linear power amplifier LPAn is failed unexpectedly, the combined linear power amplifying device may maintain the stable power amplifying function.

In summary, the combined linear power amplifying device according to the first embodiment of the present invention temporarily halts operation of the corresponding linear power amplifier if the alarm is maintained for a specified time, and repeats the same operation for a specified times. For all than, if the abnormal state is continued, the combined linear power amplifying device will completely halt operation of the linear power amplifier. However, the combined linear power amplifying device according to the second embodiment of the present invention halts operation of the corresponding linear power amplifier only, if the alarm is maintained for the specified time. Herein, the second embodiment may use a single counter, without the separate counters for accumulating the sustaining time of the respective abnormal states. That is, it is very rare that various kinds of the abnormal states are generated simultaneously in the linear power amplifier. Therefore, the device of the second embodiment simply detects the existence/nonexistence of the alarm generation and accumulates the alarm generation time by using a single counter. Of course, two or more alarms may be simultaneously generated, however the case is very rare, so that it is possible in practice to detect the failed state of the linear power amplifier by using the simple manner as the second embodiment.

As apparent from the foregoing, the combined linear power amplifying device according to the embodiment of the present invention periodically performs a self-test, opens the input/output path upon sensing a failed state in that path and, the power divider module and the power combiner module respectively divide and combine the power of the RF signal accordingly when it is determined that the corresponding linear power amplifier is turned off. Likewise, although the failed state occurs in an arbitrary linear power amplifier in the combined linear power amplifying device, an RF signal having an equivalent power level can be combined and amplified as if no failed amplifier existed. Finally, the present invention is advantageous in that the linear power amplifiers used to form the combined linear power amplifying device self-diagnose their states, perform the linear amplifying function depending on their diagnosed state, and further informs an external operator about the state of the linear power amplifier.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A combined linear power amplifying device comprising:

a power divider module which has a plurality of paths connected respectively between an input terminal and a plurality of output terminals and switches connected respectively to each of said output terminals, for dividing power of an RF signal input to said power divider module and respectively outputting said divided power to said output terminals, wherein each of said plurality of paths includes a plurality of sub-paths having a predetermined impedance, where said predetermined impedance of sub-paths nearest to said input terminal is less than said predetermined impedance of sub-paths nearest to said plurality of output terminals;

a power combiner module which has paths connected respectively between a plurality of input terminals and an output terminal and switches connected respectively to each of said input terminals, for combining power of an RF signal input to the power combiner module and outputting said combined power; and linear power amplifiers which are connected between said output terminals of said power divider module and said input terminals of said power combiner module, for linearly amplifying said RF signal power divided in said power divider module thereby outputting said linearly amplified signal to said power combiner module, and upon detection of a failed state in one of said linear power amplifiers, said failed amplifier opening a path associated therewith by turning off said corresponding switches in said power divider module and said power combiner module.

2. The device as claimed in claim 1, wherein said power divider module comprises:
   a first input sub-path of said plurality of paths connected between said input terminal of said device and a common input node, the first input sub-path having a first characteristic impedance (Z1);
   second input sub-paths of said plurality of paths connected in parallel to said common input node and having respective second characteristic impedances (Z2);
   third input sub-paths of said plurality of paths serially connected, respectively, to said second input sub-paths and having respective third characteristic impedances (Z3);
   wherein said RF switches are respectively connected between said third input sub-paths and said linear power amplifiers and switchingly controlled by said linear power amplifiers, and further wherein said first through third input sub-paths are respectively $\lambda/4$ in length such that when one of said RF switches are turned off, the corresponding dividing RF signal is reflected back to said common input node.

3. The device as claimed in claim 2, wherein said power combiner module comprises:
   first output paths connected to said corresponding RF switches of said power combiner module and having a respective characteristic impedance equivalent to the impedance (Z3) of the third input paths of the power divider module;
   second output paths respectively connected in parallel between a common output node and said corresponding first paths and having a respective characteristic impedance equivalent to the impedance (Z2) of the second input paths of the power divider module; and
   a third output path connected to said common output path and having a characteristic impedance equivalent to the impedance (Z1) of the first path of the power divider module;
   wherein said first through third output paths are respectively $\lambda/4$ in length such that when one of said RF switches is turned off, the corresponding RF signal is reflected back to said common output node.

4. The device as claimed in claim 3, wherein said linear power amplifiers using a feedforward operation include detectors for sensing the failed state therein and, in response thereto, turn off said RF switches of said power divider module and said power combiner module.

5. The device as claimed in claim 4, wherein said detectors include an over power detector for inputting outputs of said linear power amplifiers, comparing said output power with a set output power and detecting an over power fail state.

6. The device as claimed in claim 4, wherein said detectors include a high temperature detector including a temperature sensor, for comparing a set temperature with an internal temperature of said linear power amplifiers sensed from said temperature sensor and detecting a high temperature fail state.

7. The device as claimed in claim 4, wherein said detectors include a standing wave ratio detector for inputting outputs of said linear power amplifiers, detecting a difference between an output voltage of said linear power amplifier with a reflective voltage thereof and detecting a standing wave ratio fail state.

8. The device as claimed in claim 4, wherein said detectors include a supply power fail detector for inputting a supply power of said linear power amplifiers, detecting said supply power and detecting a supply power fail state upon said detected supply power exceeding a set power range.

9. The device as claimed in claim 4, wherein said detectors include a loop fail detector for inputting output of an RF signal canceler and detecting a loop fail state upon said RF signal output by said RF signal canceler being over a set time.

10. The device as claimed in claim 4, wherein said detectors include a low power detector for inputting input and output signals of said linear power amplifiers, detecting a difference between the power of said two signals, and detecting a low power fail state when said power falls below a set value.

11. The device as claimed in claim 3, wherein characteristic impedances of each path are set in a condition where Z2>Z3>Z1.

12. A combined linear power amplifying device comprising:
   a power divider module for dividing power of an RF signal having an input terminal, a plurality of output terminals, and a plurality of paths connecting said input terminal and said plurality of output terminals, wherein impedance of each of said plurality of paths increases from said input terminal to said plurality of output terminals;
   a power combiner module for combining power thereof having a plurality of input terminals and an output terminal;
   a plurality of linear power amplifiers correspondingly connected between each of said output terminals of said power divider module and each of said input terminals of said power combiner module; and
   a plurality of RF switches respectively connected to input and output terminals of said linear power amplifiers, wherein said linear power amplifiers self diagnose their operation state and open certain of said RP switches corresponding to the generation of a failed state.

13. The device as claimed in claim 12, wherein said linear power amplifier includes an over power detector for inputting outputs of said linear power amplifiers, comparing said output power with a set output power and detecting an over power fail state.

14. The device as claimed in claim 12, wherein said linear power amplifier includes a high temperature detector including a temperature sensor, for comparing a set temperature with an internal temperature of said linear power amplifiers sensed from said temperature sensor and detecting a high temperature fail state.

15. The device as claimed in claim 12, wherein said linear power amplifier includes a standing wave ratio detector for inputting outputs of said linear power amplifiers, detecting a difference between an output voltage of said linear power amplifier with a reflective voltage thereof and detecting a standing wave ratio fail state.

16. The device as claimed in claim 12, wherein said linear power amplifier includes a supply power fail detector for inputting a supply power of said linear power amplifiers, detecting said supply power and detecting a supply power fail state upon said detected supply power exceeding a set power range.

17. The device as claimed in claim 12, wherein said linear power amplifier includes a loop fail detector for inputting output of an RF signal canceler and detecting a loop fail state upon said RF signal output by said RF signal canceler being over a set time.

18. The device as claimed in claim 12, wherein said linear power amplifier includes a low power detector for inputting input and output signals of said linear power amplifiers, detecting a difference between the power of said two signals, and detecting a low power fail state wherein said power falls below a set value.

19. The device as claimed in claim 12, wherein said power divider module comprises:
  a first input sub-path of said plurality of paths connected between said device and a common input node, the first input sub-path having a first characteristic impedance (Z1);
  second input sub-paths of said plurality of paths connected in parallel to said common input node and having respective second characteristic impedances (Z2);
  third input sub-paths of said plurality of paths serially connected, respectively, to said second input sub-paths and having respective third characteristic impedances (Z3);
  wherein said RF switches are respectively connected between said third input sub-paths and said linear power amplifiers and switchingly controlled by said linear power amplifiers, and further wherein said first through third input sub-paths are respectively $\lambda/4$ in length such that when one of said RF switches are turned off, the corresponding dividing RF signal is reflected back to said common input node.

20. The device as claimed in claim 12, wherein said power combiner module comprises:
  first output paths connected to said corresponding RF switches of said power combiner module and having a respective characteristic impedance equivalent to the impedance (Z3) of the third input paths of the power divider module;
  second output paths respectively connected in parallel between a common output node and said corresponding first paths and having a respective characteristic impedance equivalent to the impedance (Z2) of the second input paths of the power divider module; and
  a third output path connected to said common output path and having a characteristic impedance equivalent to the impedance (Z1) of the first path of the power divider module;
  wherein said first through third output paths are respectively $\lambda/4$ in length such that when one of said RF switches is turned off, the corresponding RF signal is reflected back to said common output node.

21. A method of controlling a combined linear power amplifying device which has a power divider module for dividing power of an RF signal, a power combiner module for combining power thereof, and linear power amplifiers connected with RF switches respectively connected to output terminals of said power divider module and input terminals of said power combiner module, comprising the steps of:
  self diagnosing linear amplifying operation, turning off said corresponding RF switch upon sensing an abnormal state, if said abnormal state is not sensed then evenly dividing the power of said RF signal to an input terminal of a normal linear power amplifier by opening said RF switch upon said inputted RF signal being power-divided by means of said linear power amplifiers, and if said abnormal state is sensed then reflecting back to an input node a divided RF signal corresponding to said corresponding RF switch.

22. A method of controlling a combined linear power amplifying device which has a power divider module for dividing power of an RF signal, a power combiner module for combining power thereof, and linear power amplifiers connected with RF switches respectively connected to output terminals of said power divider module and input terminals of said power combiner module, comprising the steps of:
  sequentially checking an internal operation state of said linear power amplifiers by a set period, displaying a detection signal that abnormal state is generated in said checking step, accumulatively storing time when the abnormal state is generated therein, closing said RF switch upon said time when the abnormal state is generated and has lasted over the set time, and terminating RF input/output paths of said linear power amplifiers.

23. A method for controlling a combined linear power amplifying device, comprising the steps of:
  equally dividing power of an RF signal according to the number of output terminals;
  applying the power divided RF signal to a plurality of linear power amplifiers, wherein each of said linear power amplifiers detects its own state, to disconnect an input/output path upon detection of an abnormal state, so as to inactivate the linear power amplifier in the abnormal state; and
  combining powers of the RF signals generated from the linear power amplifiers in a normal state.

24. The method as claimed in claim 23, further comprising the steps of:
  checking whether the linear power amplifiers operate normally at a regular period of a first set time, to accumulate a sustaining time of the abnormal state upon detection of the abnormal state, and to initialize the accumulated time upon detection of a normal state;
  checking whether said sustaining time of the abnormal state exceeds a second set time;
  if said sustaining time exceeds the second set time, increasing an inactivation number of the linear power amplifier and disconnecting the input/output path of the linear power amplifier to inactivate said linear power amplifier for a third set time; and
  comparing the inactivation number with a set number.

25. The method as claimed in claim 23, further comprising the steps of:
  checking whether the linear power amplifiers operate normally at a regular period of a first set time, to accumulate a sustaining time of the abnormal state upon detection of the abnormal state, and to initialize the accumulated time upon detection of a normal state;
  checking whether said sustaining time of the abnormal state exceeds a second set time;
  if said sustaining time exceeds the second set time, increasing an inactivation number of the linear power amplifier and disconnecting the input/output path of the linear power amplifier to inactivate said linear power amplifier.

* * * * *